United States Patent [19]
Kamada et al.

[11] Patent Number: 5,600,819
[45] Date of Patent: Feb. 4, 1997

[54] MEMORY WITH SEQUENTIAL DATA TRANSFER SCHEME

[75] Inventors: Eiki Kamada, Hadano; Satoshi Oguni, Hachioji, both of Japan

[73] Assignee: Hitachi, Ltd., Tokyo, Japan

[21] Appl. No.: 207,744

[22] Filed: Mar. 9, 1994

[30] Foreign Application Priority Data

Mar. 12, 1993 [JP] Japan .................................. 5-052601

[51] Int. Cl.$^6$ ............................................. G06F 12/00
[52] U.S. Cl. ............................................. 395/496; 395/431
[58] Field of Search ....................... 395/494, 496, 395/438, 431, 432, 467, 495, 473; 327/279

[56] References Cited

U.S. PATENT DOCUMENTS

| | | | |
|---|---|---|---|
| 4,958,276 | 9/1990 | Kiuchi | 395/494 |
| 5,239,215 | 8/1993 | Yamaguchi | 327/297 |
| 5,325,503 | 6/1994 | Stevens | 395/473 |
| 5,410,670 | 4/1995 | Hansen | 395/496 |

*Primary Examiner*—Tod R. Swann
*Assistant Examiner*—Christopher S. Chow
*Attorney, Agent, or Firm*—Antonelli, Terry, Stout & Kraus, LLP

[57] ABSTRACT

A memory array area of a semiconductor chip is divided into a plurality of partial memories. Each partial memory is provided with a register. The distance between adjacent registers is set shorter than a maximum distance which that data can travel in the memory in one data transfer cycle defined by a clock signal. These registers are serially connected and provides a path through which addresses, input data, and control signals are transferred to desired partial memories in synchronism with the clock signal. Output data and status signals are also transferred through these registers to a memory output terminal in synchronism with the clock signal.

56 Claims, 22 Drawing Sheets

RANDOMLY READING DATA FROM PARTIAL MEMORIES AT DIFFERENT ADDRESSES AT EACH DATA TRANSFER CYCLE

COLLECTIVELY READING DIFFERENT DATA FROM PARTIAL MEMORIES AT SAME ADDRESS AT EACH DATA TRANSFER CYCLE

RANDOMLY WRITING DATA IN PARTIAL MEMORIES AT DIFFERENT ADDRESSES AT EACH DATA TRANSFER CYCLE

RANDOMLY READING DATA FROM PARTIAL MEMORIES
AT DIFFERENT ADDRESSES AT EACH DATA TRANSFER CYCLE

COLLECTIVELY READING DIFFERENT DATA FROM PARTIAL MEMORIES AT SAME ADDRESS AT EACH DATA TRANSFER CYCLE

RANDOMLY READING DATA FROM PARTIAL MEMORIES AT DIFFERENT ADDRESSES AT EACH DATA TRANSFER CYCLE

COLLECTIVELY READING DIFFERENT DATA FROM PARTIAL MEMORIES AT SAME ADDRESS AT EACH DATA TRANSFER CYCLE

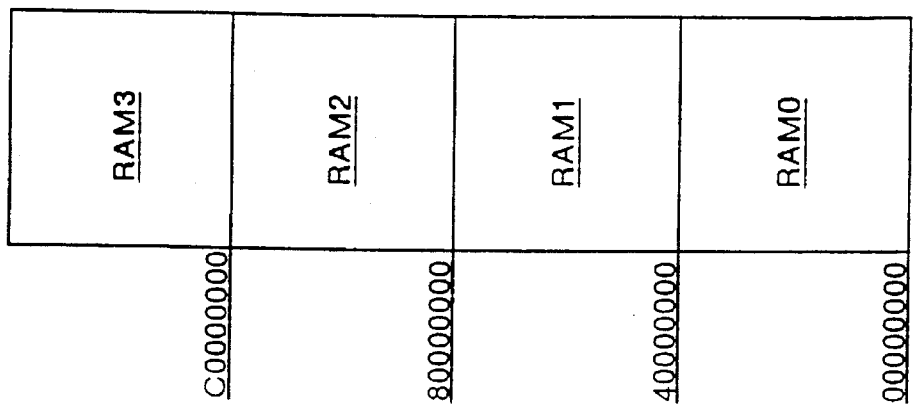
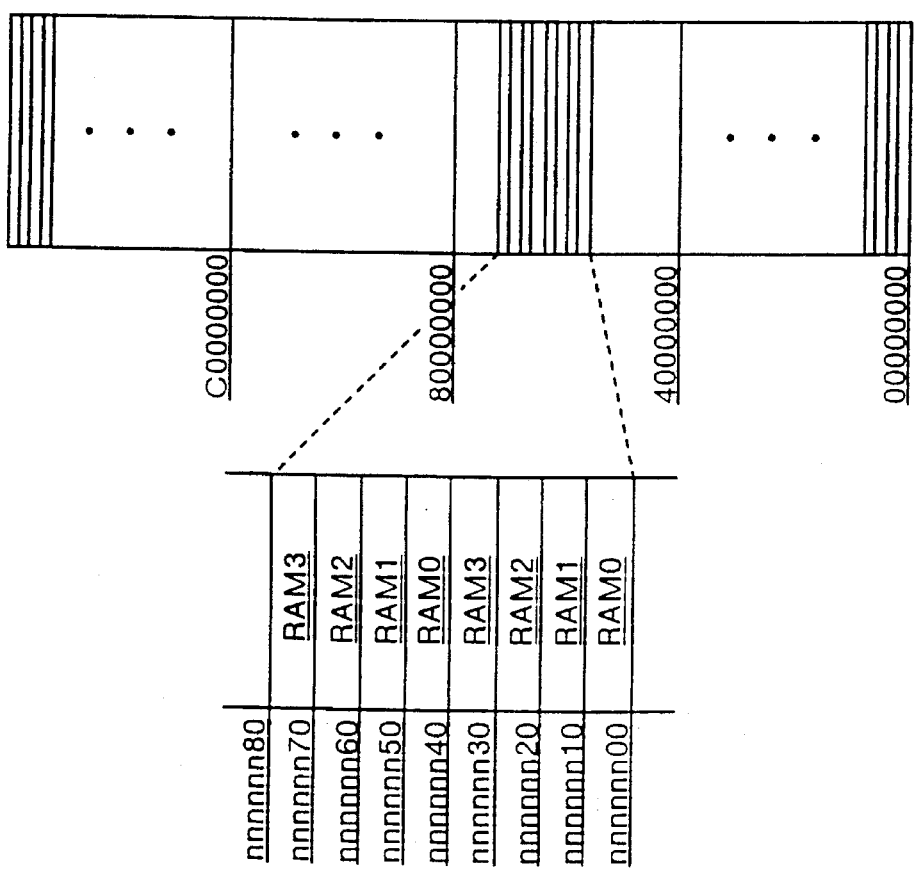

MEMORY WITH SEQUENTIAL DATA TRANSFER SCHEME

BACKGROUND OF THE INVENTION

The present invention relates to a memory, and more particularly to a memory capable of reading and writing data even in a short data transfer cycle time.

DESCRIPTION OF THE RELATED ART

Many processors for processing data are made of one chip and have improved data processing performance. The capacity per chip of a memory for storing data is increased. One chip computer systems have become available which have both a processor and a memory fabricated on one chip.

The data processing performance of a processor is given by an inverse of a product of a cycle time and the average number of cycles of executing instructions. Generally speaking, the cycle time has been shortened by an improvement in device technology, and the average number of instruction execution cycles has been reduced by a technical improvement in a logic method.

Recently, an overhead of memory read/write has greatly affected the average number of instruction execution cycles. To solve this, systems for writing and reading data to and from a memory at high speed have been proposed, as disclosed, for example, in JP-A-58-146082, JP-A-58-62752, and JP-A-1-303544.

The capacity of a memory is increasing because of various requests from application fields of computer systems and because of high integration of a chip stemmed from improved device technology. As a result, there is a tendency that the area of a memory occupies a large area of one chip computer system.

A logic method developed for improving the performance of a processor is likely to increase the size of processor logic. In addition, the memory capacity is becoming large. The increased size of processor logic and the increased memory capacity are related directly to an increased area of a one chip computer system. A chip of several cm square is available nowadays.

Apart from the above-described background, in order to improve the data processing performance of a processor, a cycle time has been much shortened. A processor operating at a frequency of several hundreds MHz is available nowadays. It is expected that a chip operating over 1 GHz will be realized sooner or later. This operation frequency corresponds to a cycle time of several ns to several hundreds ps.

With an increased chip area and a shortened cycle time, there arises more or less a serious issue that a signal transmitted from a certain point within a chip becomes unable to reach all points of the chip in one data transfer cycle. A distance a signal can propagate on a chip in a cycle time of 1 ns is about several cm to several mm when considering gate delays, wiring delays, clock skews, and the like.

The capacity of a memory is increasing on one hand, and on the other hand the degree of shortening a memory access time cannot follow the degree of shortening a cycle time. As a result, there arises more or less a serious issue that data cannot be read and written in one data transfer cycle.

SUMMARY OF THE INVENTION

It is an object of the present invention to provide a memory capable of reading and writing data even in a short data transfer cycle time.

It is another object of the present invention to provide a one chip computer system capable of reading and writing data even in a data transfer cycle time defined by a short machine cycle time.

The above objects of the present invention can be achieved by dividing a memory array of a memory into a plurality of partial memory arrays (hereinafter called "partial memory"), and by providing the partial memories with a plurality of temporary storage means connected in series and provided in correspondence with the partial memories, wherein addresses and data are transferred through these temporary storage means synchronously with a data transfer cycle.

With the above-described structure, addresses and data can be transferred through the temporary storage means synchronously with a data transfer cycle. Accordingly, a reliable data read/write operation can be ensured even for a memory having such a large capacity as data cannot be transferred from one end to the other end of a memory array in one data transfer cycle time.

Also with the above-described structure, addresses and data are stored in the associated temporary storage means. Accordingly, addresses or data are not missed in the memory even the memory access time is longer than the data transfer cycle time.

In reading data from the memory, addresses are sequentially transferred via a transfer path provided with a plurality of temporary storage means to the selected partial memories. When an address reaches a selected partial memory, a data read operation starts whereby data is read from a memory cell of the selected partial memory designated by the address. When the data read operation is completed, the read data is outputted from the selected partial memory. The read data outputted from the partial memory is stored in the temporary storage means and sequentially transferred via a transfer path in each data transfer cycle.

Similarly, in writing data to the memory, addresses and write data are sequentially transferred via a transfer path provided with a plurality of temporary storage means to the selected partial memories. A data write operation is performed whereby data is written in a memory cell of the selected partial memory designated by the address.

The data read/write operation can be executed in parallel relative to a plurality of memories or partial memories.

BRIEF DESCRIPTION OF THE DRAWINGS

FIGS. 22A and 22B show examples of physical address allocation of memories of this invention.

DESCRIPTION OF THE PREFERRED EMBODIMENTS

Figure 1:
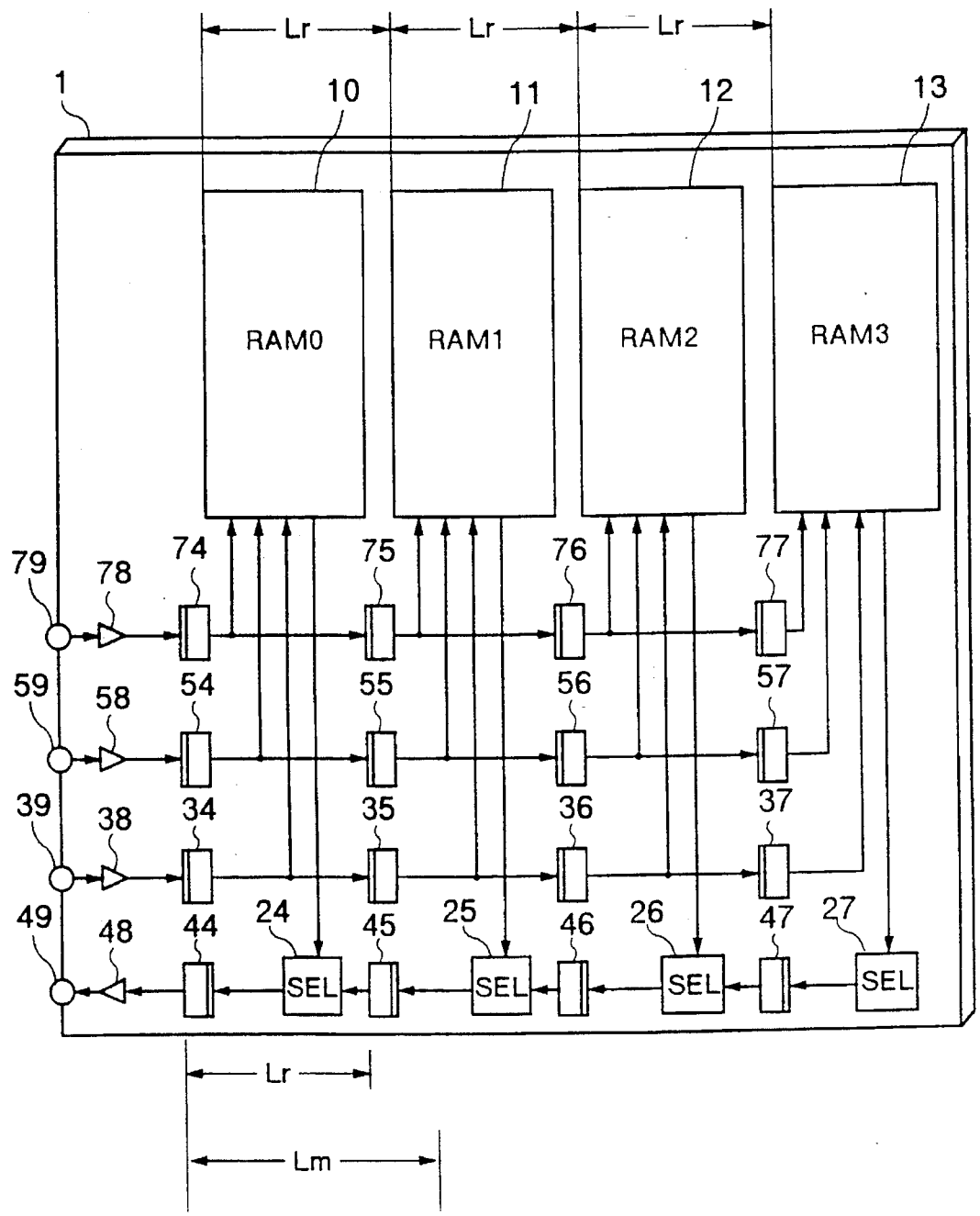
FIG. 1 is a block diagram showing the structure of a memory chip incorporating a sequential data transfer scheme according to an embodiment of this invention.

Embodiments of the present invention will be described with reference to the accompanying drawings. FIG. 1 shows an internal structure of a memory chip 1 fabricated on a single chip and incorporating a sequential data transfer scheme according to the present invention. A memory unit for storing data includes a plurality of partial memories 10 to 13 each having the same size.

Address registers 54 to 57, serving as temporary storage means, are pipeline registers connected in series for sequentially transferring addresses from an external signal pin 59 via an input buffer 58 to the partial memories 10 to 13. Write data registers 34 to 37, serving as temporary storage means, are pipeline registers connected in series for sequentially transferring write data from an external signal pin 39 via an input buffer 38 to the partial memories 10 to 13. Read data registers 44 to 47, serving as temporary storage means, are pipeline registers connected in series for sequentially transferring read data from the partial memories 10 via 13 to an output buffer 48 to an external signal pin 49. Read data selectors 24 to 27 are selectors for arbitrating conflicts among a plurality of read data from the read data registers 44 to 47. Control registers 74 to 77, serving as temporary storage means, are the pipeline registers connected in series for sequentially transferring control information from an external signal pin 79 via an input buffer 78 to the partial memories 10 to 13. Each register described above is assigned to a corresponding one of the partial memories 10 to 13. In this embodiment, the above-described pipeline registers and selectors are formed at positions spaced by a distance Lr, which is shorter than a maximum data transfer distance Lm in one data transfer cycle. The partial memories 10 to 13 are preferably disposed at positions spaced by a distance Lr in geometrical symmetry. However, the layout of the partial memories 10 to 13 is not absolutely limited to such a layout. The characteristic feature of the memory chip 1 shown in FIG. 1 is that the transfer direction of read data is opposite to that of addresses and write data.

Next, the read/write operation of the memory chip 1 shown in FIG. 1 will be explained briefly.

Figure 7:
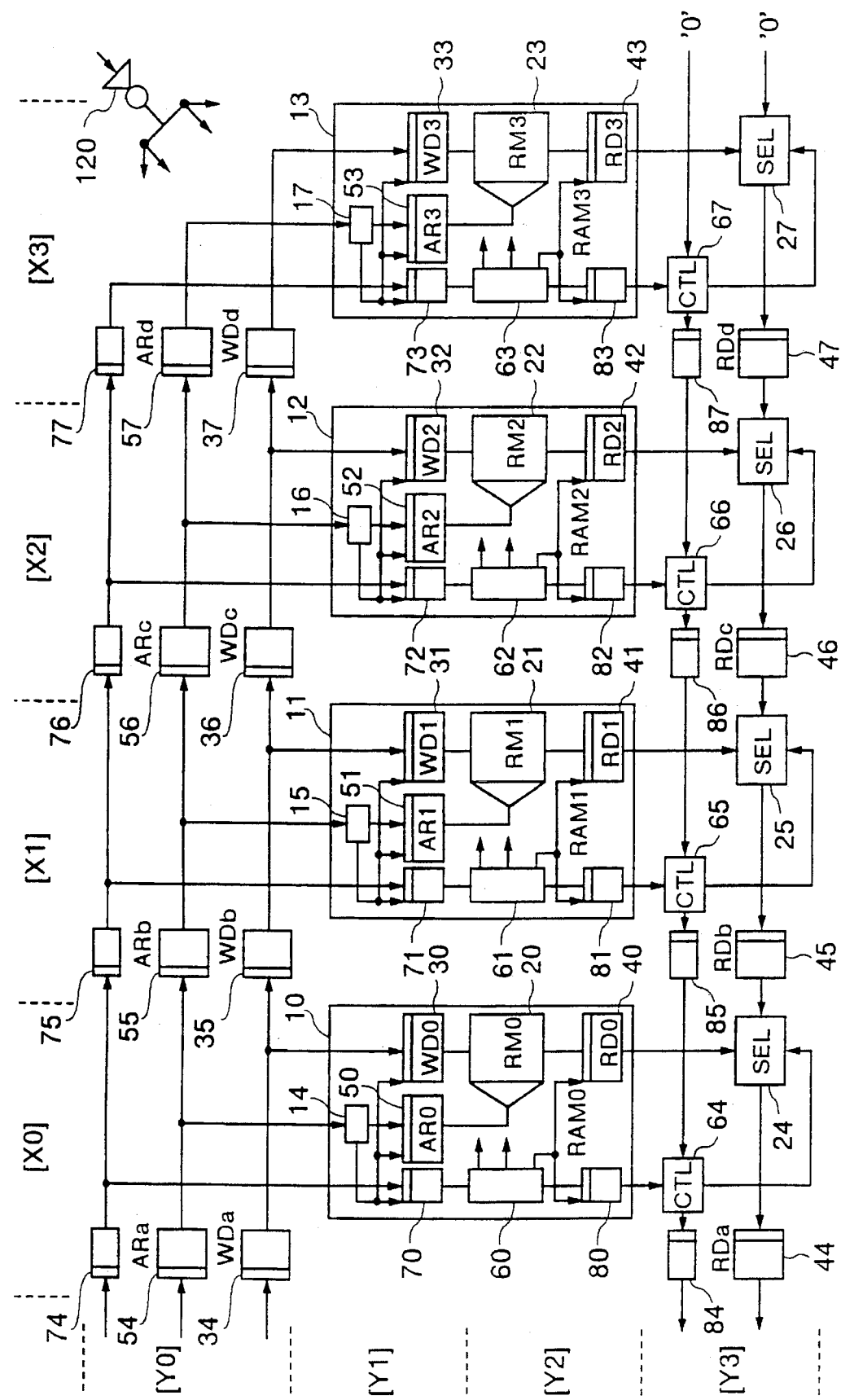
FIG. 7 is a block diagram showing another example of the logical structure of the partial memory group shown in FIG. 1.

In reading data from the memory chip, a read operation start signal is supplied to the external signal pin 79, and a read address is supplied to the external signal pin 59. A partial memory selection signal for selecting one of the partial memories 10 to 13 is generated at the outside of the memory chip 1 and supplied to the external signal pin 79. Alternatively, as shown in FIG. 7, the partial memory selection signal is generated in the memory chip by decoding part of the read address. The partial memory selection signal and the read address are transferred to the selected partial memory via the pipeline registers 74 to 77 and 54 to 57. When the read address reaches the selected partial memory, a data read operation starts for a particular memory cell in the partial memory designated by the address. This read operation can be executed in parallel for a plurality of partial memories.

When the read operation is completed, read data is outputted from the selected partial memory. The read data outputted from the partial memory is selected by one of the read data selectors 24 to 27 if there is no conflict of read data between the selected partial memory and other partial memories. The selected read data is sequentially transferred via the pipeline registers 44 to 47 to the external signal pin 49 and outputted therefrom. In the memory chip 1 shown in FIG. 1, the direction of transferring read data is opposite to the direction of transferring write data.

In writing data to the memory chip, a write operation start signal is supplied to the external signal pin 79, a write address is supplied to the external signal pin 59, and write data is supplied to the external signal pin 39. The partial memory selection signal, write address, and write data are transferred to the selected partial memory via the pipeline registers 74 to 77, 54 to 57, and 34 to 37. When the write address and data reach the selected partial memory, a data write operation starts for a particular memory cell in the partial memory designated by the address. This write operation can be executed in parallel for a plurality of partial memories.

Figure 2:
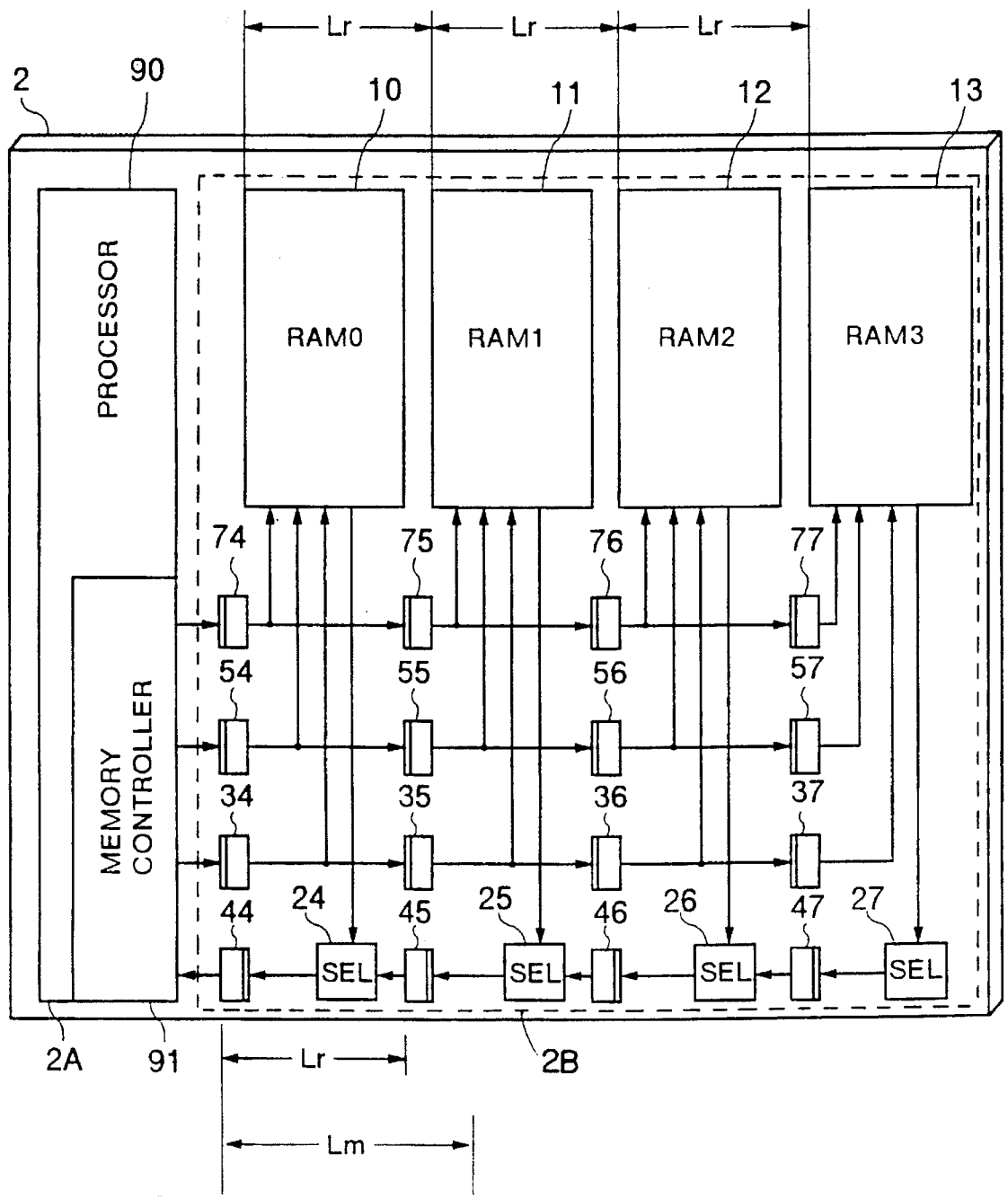
FIG. 2 is a block diagram showing the internal structure of a one chip computer system using the memory shown in FIG. 1.

FIG. 2 shows the internal structure of a one chip computer system using a memory of this invention. A computer system chip 2 has a processor unit 2A for processing data and a memory unit 2B for storing data. The processor unit 2A is constituted by a processor 90 which has a memory controller 91. Upon reception of a memory access request for data read/write generated by the processor 90, the memory controller 91 generates control signals necessary for controlling the memory unit 2B. The memory unit 2B is structured like the memory chip 1 shown in FIG. 1. Addresses, read/write data, and control signals are directly transferred between the memory unit 2B and memory controller 91 without using the external signal pins and input/output buffers shown in FIG. 1. Therefore, the read/write operation of the memory unit 2B, as viewed from the memory controller 92, is the same as the read/write operation of the memory chip 1 as viewed from the external signal pins shown in FIG. 1.

The distances Lr between adjacent pipeline registers and between pipeline registers and partial memories, respectively, of the memory chip 1 shown in FIG. 1 and the computer system chip 2 shown in FIG. 2, will be explained.

The size of computer chips is becoming larger year after year, and there is even a chip of several cm square. The operating frequency has also been improved, and there is a chip even having an operating frequency over 1 GHz and a corresponding machine cycle time of 1 ns and lower. Under these conditions, a signal transmitted from one position in a chip has become unable to reach all other positions in one machine cycle. In addition, a maximum signal transfer distance Lm in one machine cycle has become short.

For a direct data transfer between two registers (including latch/flip-flop and buffer) spaced by the maximum distance Lm or longer on a chip, the transmitting side register is required to hold its data over one-machine cycle, so that a data transfer period becomes long. One method of solving this problem is to provide pipeline registers on a data transfer path having a distance Lm or longer, at positions spaced by a distance Lm at the longest. With such pipeline registers, data can be transferred by using one machine cycle as one data transfer cycle.

The memories of the memory chip 1 shown in FIG. 1 and the computer system chip 2 shown in FIG. 2 are divided into a plurality of partial memories 10 to 13. The area of each partial memory 10 to 13 is proportional to its memory capacity. As a result, the distance Lr between adjacent partial memories is proportional to about a square root of the memory capacity. If Lr≦Lm is met, pipeline registers disposed at an interval of a distance Lr as shown in FIGS. 1 and 2 allow signals such as addresses and read/write data to be transferred by using one machine cycle as one data transfer cycle. If Lr≦Lm/2 is met, signals can be transferred by using a half machine cycle as one data transfer cycle. Similarly, if Lr≦Lm/4, signals can be transferred by using a quarter machine cycle as one data transfer cycle. On the other hand, in the case of Lr>Lm, additional pipeline registers corresponding in number to an integer of Lr/Lm with its fractional part being cut off are provided in addition to already provided pipeline registers, to thereby allow signals to be transferred in each one data transfer cycle.

In order to realize the above-described system, it is necessary to supply clocks at the same time (or at least at a small skew) to a number of registers (latch/flip-flop) including pipeline registers provided at different positions in a large scale, high integration logic chip such as the memory chip 1 shown in FIG. 1 and computer system chip 2 shown in FIG. 2.

Figure 3:
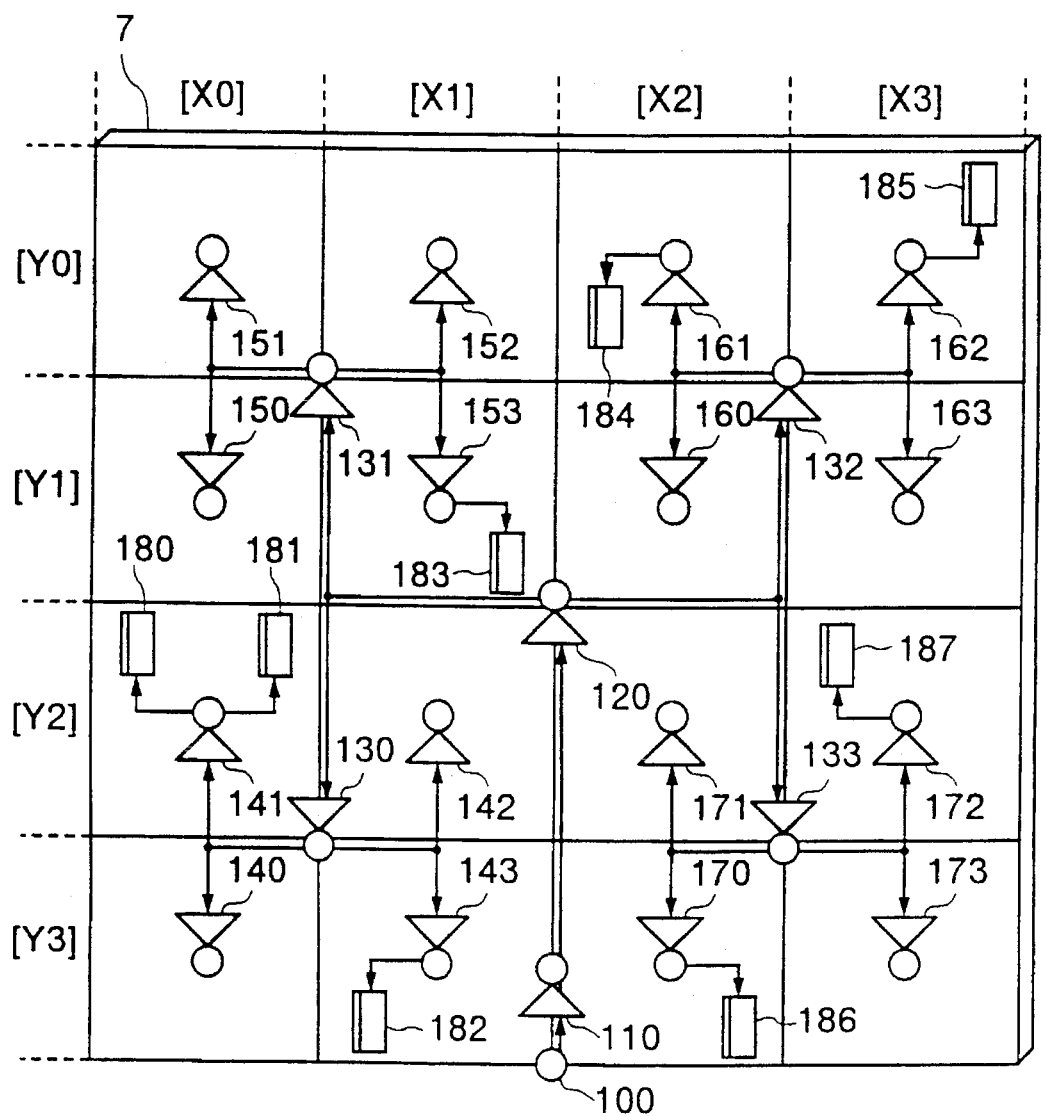
FIG. 3 shows an example of a clock supply system for the memory shown in FIG. 1.

FIG. 3 is a schematic diagram showing an example of a clock supply system for a large scale, high integration logic chip 7. A clock is inputted from an external clock pin 100 and supplied via a clock input buffer 110 to a first clock driver 120. The clock is then supplied to second clock drivers 130 to 133 and to third clock drivers 140 to 143, 150 to 153, 160 to 163, and 170 to 173, via wirings of the same length. The large scale, high integration logic chip 7 is divided into a plurality of small areas (in this example, sixteen areas) X0Y0, X1Y1, . . . , X3Y3. Each small area is provided with a single third clock driver. A clock is eventually supplied from the third clock driver to all registers in the small area, via wirings of the same length. If the number of registers is different between respective small areas, a necessary dummy load is added to provide each third clock driver with the same load. In this manner, transfer delays of a clock from the external clock pin 100 to all registers 180 to 187 in the chip become equal so that the clock can be supplied at the same time (or at least a small skew).

It is obvious that other storage means for temporarily storing data and signals may be used in place of registers.

Instead of the clock driving means using the clock supply system for supplying clocks to all registers at the same time, another driving means operating in response to asynchronous signals may be provided at transfer paths and memory areas. In this case, each data contains a start bit and a stop bit as a single unit, and is sequentially transferred in response to an asynchronous signal. Alternatively, a self-synchronizing type synchronizing-type driving means may be used. In this case, each data is sequentially transferred in a hand shaking manner by using a request signal and an acknowledge signal.

Figure 4:
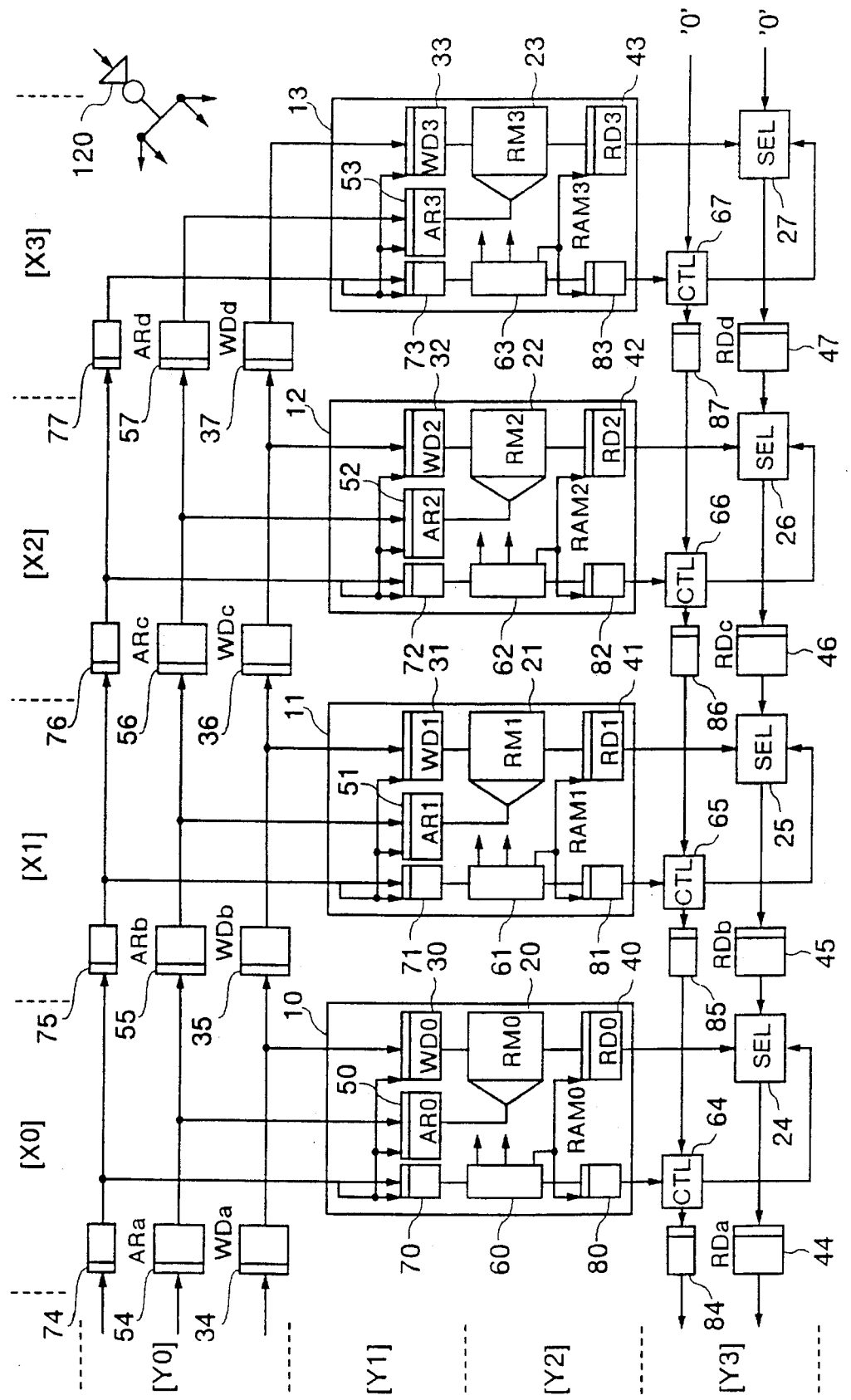
FIG. 4 is a block diagram showing an example of a logical structure of the partial memory group shown in FIG. 1.

FIG. 4 shows the logical structure of the memory chip 1 shown in FIG. 1 and the memory unit 2B of the computer system chip 2 shown in FIG. 2.

Each small area X0Y0 to X3Y3 of the memory chip shown in FIG. 4 corresponds to each small area X0Y0 to X3Y3 shown in FIG. 3. Memory arrays 20 to 23 each are a group of memory cells for storing data. Internal address registers 50 to 53 are the registers for holding addresses of the memory arrays 20 to 23 for the data read/write, and receiving addresses from the address registers 54 to 57. Internal write data registers 30 to 33 are the registers for holding write data to the memory arrays 20 to 23, and receiving write data from the write data registers 34 to 37. Internal read data registers 40 to 43 are the registers for holding read data from the memory arrays 20 to 23, and sending read data to the read data registers 44 to 47 via the read data selectors 24 to 27.

Internal control registers 70 to 73 are the registers for holding control information for the data read/write of the memory arrays 20 to 23, and receiving control information from the pipeline control registers 74 to 77. Internal status registers 80 to 83 are the registers for holding status information representing the data read/write of the memory arrays 20 to 23, and sending status information to pipeline status registers 84 to 87 via read data controllers 64 to 67.

Partial memory controllers 60 to 63 control a data read/write operation in the partial memories 10 to 13 and set status information to the internal status registers 80 to 83, in accordance with the control information held by the internal control registers 70 to 73. The control information held by the internal control registers 70 to 73 includes, for example, partial memory select information, data read/write operation start information, and the like. The status information set to the internal status registers 80 to 83 includes, for example, partial memory select information, data read/write operation completion status (normal/abnormal) information, and the like. The internal status registers 80 to 83 have status flags representing a data read/write operation completion status.

The read data controllers 64 to 67 control the read data selectors 24 to 27 and generate status information to be sent to the next stage status registers 84 to 87, in accordance with status information sent from the internal status registers 80 to 83 and from the preceding stage status registers 85 to 87 and a "0" level as an output from a virtual most preceding stage.

Figure 5:
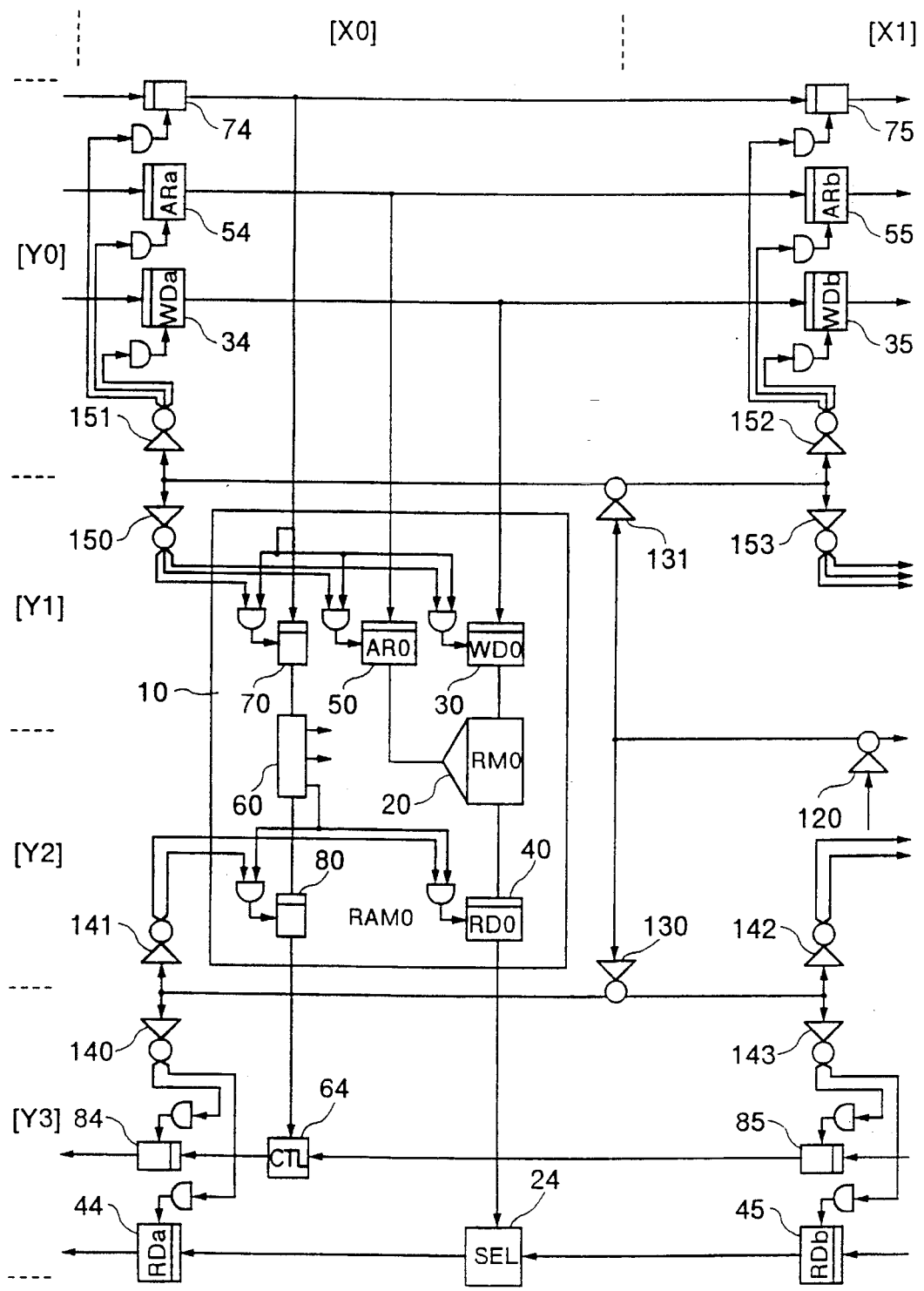
FIG. 5 is a diagram showing an example of a clock supply system for the partial memory group shown in FIG. 4.

The clock supply operation at each partial memory will be explained with reference to FIG. 5. FIG. 5 is an enlarged view of the partial memory 10. The first clock driver 120 supplies a clock to the second clock drivers 130 to 133. The second clock drivers 130 to 133 supplies a clock to the third clock drivers 140 to 143, 150 to 153, 160 to 163, and 170 to 173, a single third clock driver being provided at each small area of the memory chip. Each third clock driver supplies a clock to all registers in the small area. For example, the third clock driver 151 supplies a clock to the address register 54, write data register 34, and control register 74 in its small area, and the third clock driver 150 supplies a clock to the internal address register 50, internal write data register 30, and internal control register 70 in its small area. With such a clock supply system, a clock can be supplied to all registers in the chip at the same time (or at least at a small skew).

The details of a data read operation will be given by taking the partial memory 12 shown in FIG. 14 by way of example. The operations of the other partial memories 10, 11, and 13 are similar to the operation of the partial memory 12.

In reading data from the partial memory 12, control information representing the selection and read operation start of the partial memory 12 is sequentially transferred to the control registers 74 to 77, and a read address is sequentially transferred to the address registers 54 to 57. The control information is sent from the control registers 74 to 77 to the internal control registers 70 to 73. If the control information supplied from the control register 76 to the internal register 72 indicates a selection of its own partial memory 12, the read address in the address register 56 is set to the internal address register 52. On the other hand, if the control information does not indicate a selection of its own partial memory 12, the previously set address is maintained unchanged and is being set to the internal address register 52.

When the control information instructing a selection and read operation start of the partial memory 12 is set to the internal control register 72, the partial memory controller 62 generates control signals necessary for reading data from the memory array 22 to start the read operation. When the read operation of the memory array 22 is completed, the partial memory controller 62 sets the status flag in the internal status register 82 to "1" and maintains it for only one machine cycle time, the status flag "1" indicating a data read completion. For example, if the number of memory access cycles to a partial memory is 4 (bit is equal to an access time which means the exceeds 3 machine cycles but is equal to or shorter than 4 machine cycles), the status flag in the internal status register 82 is set to "1", and the "1" state is maintained for only 1 machine cycle when 4 machine cycles after the control information instructing a selection and read operation start was set to the internal control register 72. To this end, a delay line for 4 machine cycle time or a three-stage shift register shifting each one machine time may be inserted between the internal control register 72 and internal status register 82. The partial memory controller 62 sets status information to the internal status register 82, the status information representing an identification of its partial memory and a read operation status. The partial memory controller 62 also sets the read data to the internal read data register 42. The status information and read data are held until the next read operation is completed and new status information and read data are set.

After the status flag in the internal status register 82 representing the read operation completion was set, the read data controller 66 controls the read data selector 26 to transfer the read data outputted from the internal read data register 42 to the read data register 46.

Because a plurality of read data registers 44 and 47 are used in common for transferring read data outputted from a plurality of internal read data registers 40 to 43, a conflict may occur between the read data registers 44 to 47 transferring read data. This conflict between the read data registers 44 to 47 can be eliminated by the read data selectors 24 to 27. The read data selectors 24 to 27 select either the read data sent from the internal read data registers 40 to 43 or the read data sent from the preceding read data registers 45 to 47 and a "0" level as an output from a virtual most preceding stage, and transfer the selected read data to the next stage read registers 44 to 47. The read data controllers 64 to 67 control the read selectors 24 to 27 for the selection of read data.

In this embodiment, the read data selectors 24 to 27 preferentially select the read data sent from the respective preceding stage read data registers 45 to 47 (however, read data sent from a virtual most preceding data register just before the read data selector 27 is "0" and so the read data from RAM3 is always selected). In this manner, once the read data sent from the internal read data registers 40 to 43 is selected by the read data selectors 24 to 27, the selected read data is sequentially transferred to the next stage read data registers 44 to 47.

Generally, buffers (queues) are required for holding and retaining read data not selected at an occurrence of a conflict because of a low priority order thereof. However, in this embodiment, read data set to the internal read data registers 40 to 43 is held until the next read operation is completed and new read data is set. It is therefore unnecessary to provide such buffers for holding read data set to the internal read data registers, on the assumption that the number of partial memories is equal to the number of partial memory access cycles or less. In the following description, it is assumed that the number of partial memories is 4 blocks and the number of partial memory access cycles is 4 cycles.

At the same time when the read data outputted from the internal read data registers 40 to 43 is transferred, the status information representing partial memory identifications and read operation completion status outputted from the internal status registers 80 to 83 is also transferred. Since the status registers 84 to 87 are used in common for transferring status information, a conflict between status registers 84 to 87 occurs at the same time when a conflict between the read data registers 44 to 47 occurs. The conflict between the status registers 84 to 87 can be removed by the same control as a conflict between the read data registers 44 to 47. The read data controllers 64 to 67 each have a circuit for selecting either control information sent from each of the internal status registers 80 to 83 or control information sent from each of the preceding stage status registers 85 to 87 and most preceding stage ("0") and transferring the selected control information to each of the next stage status registers 84 to 87, and a circuit for generating a status flag representing the transfer status at each of the next stage read data registers 44 to 47 and status registers 84 to 87.

Figure 6:
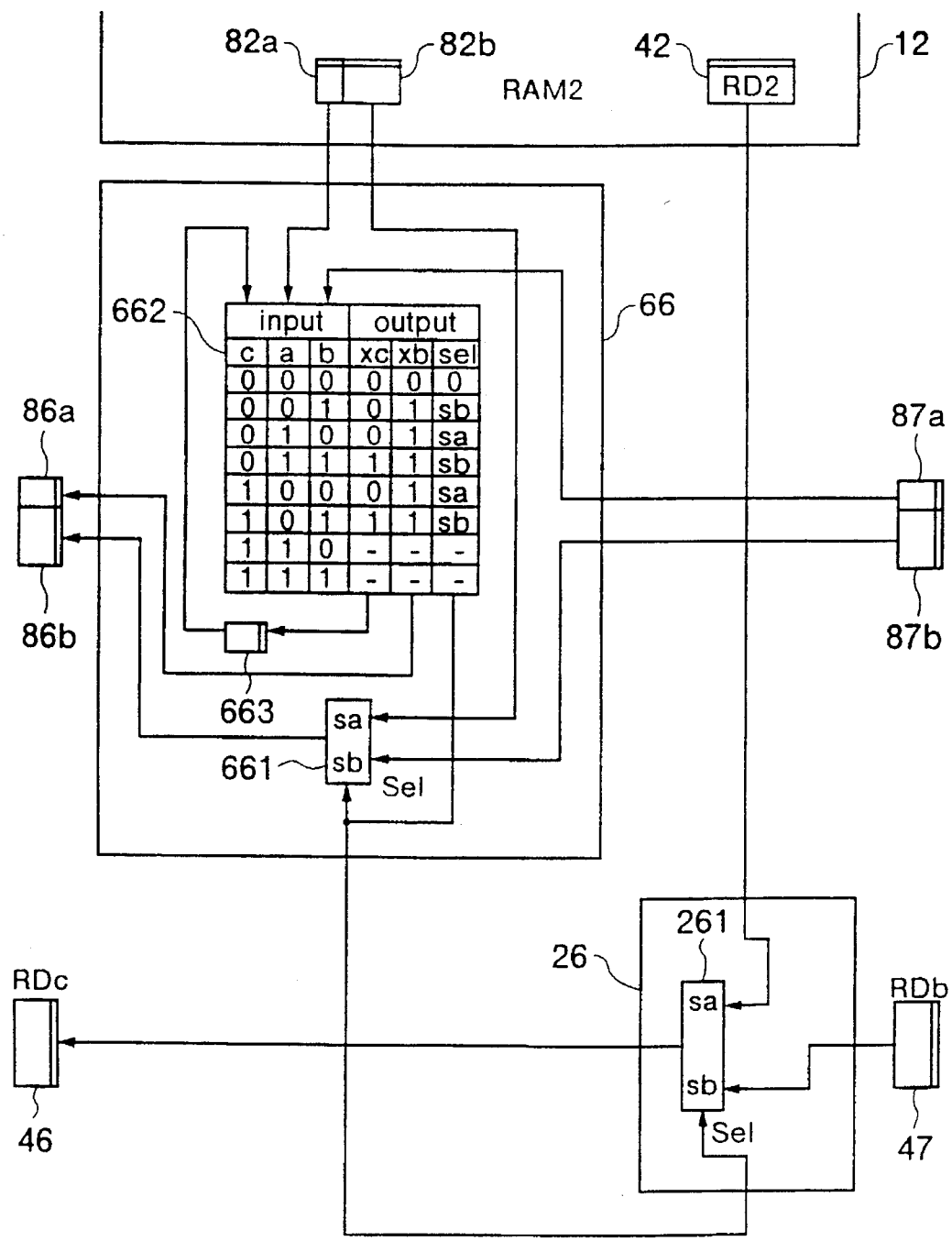
FIG. 6 shows an example of the detailed logical structure of the read data selector and read data controller of the memory shown in FIG. 1.

FIG. 6 shows the detailed logical structure of the read data selector 26 and read data controller 66 of the partial memory 12.

As shown in FIG. 6, the internal status register 82, and status registers 86 and 87 are divided into status flag fields 82a, 86a, and 87a and status information fields 82b, 86b, and 87b. The status flag field 82a of the internal status register 82 has a status flag representing a read operation completion, whereas the status information field 82b of the internal status register 82 is set with status information representing an identification and read operation completion of the partial memory 12 to indicate the cycle when the read data was set to the internal read data register 42. The status flag fields 86a and 87a of the status registers 86 and 87 each have a status flag representing an execution of a sequential transfer operation, whereas the status information fields 86b and 87b each are set with status information sequentially transferred to indicate the cycle when the read data was sequentially transferred to and held in the read data registers 46 and 47.

The read data selector 26 has a data selector 261. Under the control of a select signal sent from a transfer control logic 662 of the read data controller 66 to an input Sel of the data selector 261, the data selector selects either read data held in the internal read data register 42 and supplied to one input sa or read data held in the read data register 47 and supplied to another input sb, and outputs the selected read data. The read data outputted from the data selector 261 is transferred to the read data register 46.

The read data controller 66 has a status information selector 661, a transfer control logic 662, and a transfer suspension flag 663. Under the control of a select signal sent from the transfer control logic 662 to an input Sel of the status information selector 661, this selector 661 selects either status information held in the internal read status register 82b and supplied to one input sa or status information held in the status register 87b and supplied to another input sb, and outputs the selected status information. The status information outputted from the status information selector 661 is transferred to the status register 86b.

The transfer control logic 662 controls the transfer of read data from the data selector 261 to the read data register 46 and the transfer of status information from the status information selector 661 to the status information field 86b of the status register 86. The transfer control logic 662 detects an occurrence of a conflict relative to the read data register 46 and a conflict relative to the status information field 86b of the status register 86, and arbitrates the conflict. A conflict relative to the read data register 46 occurs at the cycle when read data still not transferred is held in both the internal read data register 42 and the read data register 47, whereas a conflict relative to the status information field 86b of the status register 86 occurs at the cycle when status information still not transferred is held in both the status information field 82b of the internal status register 82 and the status information field 87b of the status register 87. When a conflict relative to the read data register 46 occurs, the data selector 261 preferentially selects read data sent from the read data register 47, whereas when a conflict relative to the status information field 86b of the status register occurs, the status information selector 661 preferentially selects status information sent from the status information field 87b of the status register 87.

The operation of the transfer logic 662 shown in FIG. 6 will be explained in more detail. In the transfer control logic 662, an input a is supplied with a status flag representing a read operation completion, the status flag being sent from the status flag field 82a of the internal status register 82, and an input b is supplied with a status flag representing an execution of a sequential transfer operation, the status flag being sent from the status flag field 87a of the status register 87. An input c is supplied with a status flag representing a suspension of a transfer operation after a read operation completion, the status flag being sent from the transfer suspension flag 663.

First, the cycle in which all the status flags supplied to the inputs a, b, and c are "0", means that there is no read data and status information to be transferred. In this case, a select signal "0" is outputted from an output sel to control the data selector 261 and status information selector 661 so as to output "0". A status signal "0" is outputted from an output xb so that the status flag field 86a of the status register 86 is set to "0", thereby informing at the next cycle that read data and status information have not been transferred to the read register 46 and the status information field 86b of the status register 86.

The cycle in which the input a is supplied with a status flag "1" and the inputs b and c are supplied with status flags "0", means that although read data and status information to be transferred have been set to the internal read data register 42 and the status information field 82b of the internal status register, there is no read data and status information in the read data register 47 and the status information field 87b of the status register to be preferentially transferred. In this case, a select signal "sa" is outputted from the output sel to control the data selector 261 and status information selector 661 so as to select and output the read data and status information in the internal read data register 42 and the status information field 82b of the internal status register 82. A status signal "1" is outputted from the output xb so that the status flag field 86a of the status register 86 is set to "1", thereby informing at the next cycle that read data and status information have been transferred to the read data register 46 and the status information field 86b of the status register 86.

The cycle in which the input b is supplied with a status flag "1" and the inputs b and c are optional, means that the read data register 47 and the status information field 87b of the status register 87 have held read data and status information to be preferentially transferred. In this case, a select signal "sb" is outputted from the output sel to control the data selector 261 and status information selector 661 so as to select and output the read data and status information in the read data register 47 and the status information field 87b of the internal status register 87. A status signal "1" is outputted from the output xb so that the status flag field 86a of the status register 86 is set to "1", thereby informing at the next cycle that read data and status information have been transferred to the read data register 46 and the status information field 86b of the status register 86. The cycle in which the input a or c is also supplied with a status flag "1", means that there is an occurrence of a conflict relative to the read data register 46 and the status information field 86b of the status register 86. In this cycle, the transfer of read data and status information set to the internal read data register 42 and the status information field 82b of the internal status register 82 after the read operation completion is suspended because of a low priority order. In this case, a status signal "1" is outputted from the output xc so that the transfer suspension flag 663 is set to "1", thereby informing at the next cycle that the transfer operation after the read operation completion has been suspended.

The cycle in which the input c is supplied with a status flag "1" and the inputs a and b are supplied with status flags "0", means that although read data and status information to be transferred have been set to the internal read data register 42 and the status information field 82b of the internal status register, they have not been transferred as yet and suspended and there is no read data and status information to be preferentially transferred in the read data register 47 and the status information field 87b of the status register 87. In this cycle, therefore, the same control is performed as in the case of the cycle in which the input a is supplied with a status flag "1" and the inputs b and c are supplied with status flags "0".

Lastly, if the number of partial memories is equal to or less than the number of partial memory access cycles, there is no cycle in which both the inputs a and c are supplied with a status flag "1" at the same time. Accordingly, it is not necessary to consider such cycles.

Returning back to FIG. 4, the details of a data write operation will be given by taking the partial memory 12 by way of example. The operations of the other partial memories 10, 11, and 13 are similar to the operation of the partial memory 12.

In writing data in the partial memory 12, control information representing the selection and write operation start of the partial memory 12 is sequentially transferred to the control registers 74 to 77, a write address is sequentially transferred to the address registers 54 to 57, and write data is sequentially transferred to the write data registers 34 to 37. The control information is sent from the control registers 74 to 77 to the internal control registers 70 to 73. If the control information supplied from the control register 76 to the internal register 72 indicates a selection of its own partial memory 12, the write address in the address register 56 is set to the internal address register 52 and the write data in the write data register 36 is set to the internal write data register 32.

On the other hand, if the control information does not indicate a selection of its own partial memory 12, the previously set address is maintained unchanged and is being set to the internal address register 52, and also the previously set write data is maintained unchanged and is being set to the internal write data register 32.

When the control information instructing a selection and read operation start of the partial memory 12 is set to the internal control register 72, the partial memory controller 62 generates control signals necessary for writing data into the memory array 22 to start the write operation. When the write operation of the memory array 22 is completed, the partial memory controller 62 sets the status flag in the internal status register 82 to "1" and maintains it for only one machine cycle time, the status flag "1" indicating a data write completion. The partial memory controller 62 also sets status information to the internal status register 82, the status information representing an identification of its partial memory and a write operation completion status. The status information is held until the next write operation is completed and new status information is set.

After the status flag in the internal status register 82 representing the write operation completion was set, the read data controller 66 controls to transfer the status information outputted from the internal status register 82 to the status register 86. In order to sequentially transfer status information, a control similar to the read operation is performed also in the write operation. The status information representing a write operation completion may be used for evaluating whether write data has been normally written in the partial memory 12. If such status information is not necessary, the transfer of status information can be omitted.

FIG. 7 shows another example of the logical structure of the memory chip and the memory unit of a computer system chip shown in FIG. 4.

The different point from FIG. 4 is that address decoders 14 to 17 are provided in the partial memories 10 to 13 shown in FIG. 7. In FIG. 7, like elements to those shown in FIG. 4 are represented by using identical reference numerals and symbols. A partial memory or memories for which data read/write operation is performed, are selected in accordance with control information which is obtained by the address decoders 14 to 17 by decoding an address sequentially transferred to the address registers 54 to 57. Each address contains an address portion for selecting one or all of the partial memories 10 to 13 and an address portion for selecting one word in each of the memory arrays 20 to 23. An address portion for selecting all of the partial memories becomes necessary when data is collectively read from or written in all the partial memories at the same address, as will be described later.

In the example shown in FIG. 4, a partial memory for which data read/write operation is performed, is selected in accordance with control information which is generated at the outside of the partial memories and sequentially transferred to the control registers 74 to 77. In this case, an address contains only an address portion for selecting one word of each memory array 20 to 23.

FIGS. 8 to 11 are timing charts explaining the data read/write operation in which the pipeline registers sequentially transfer data by using one machine cycle as one data transfer cycle.

Figure 8:
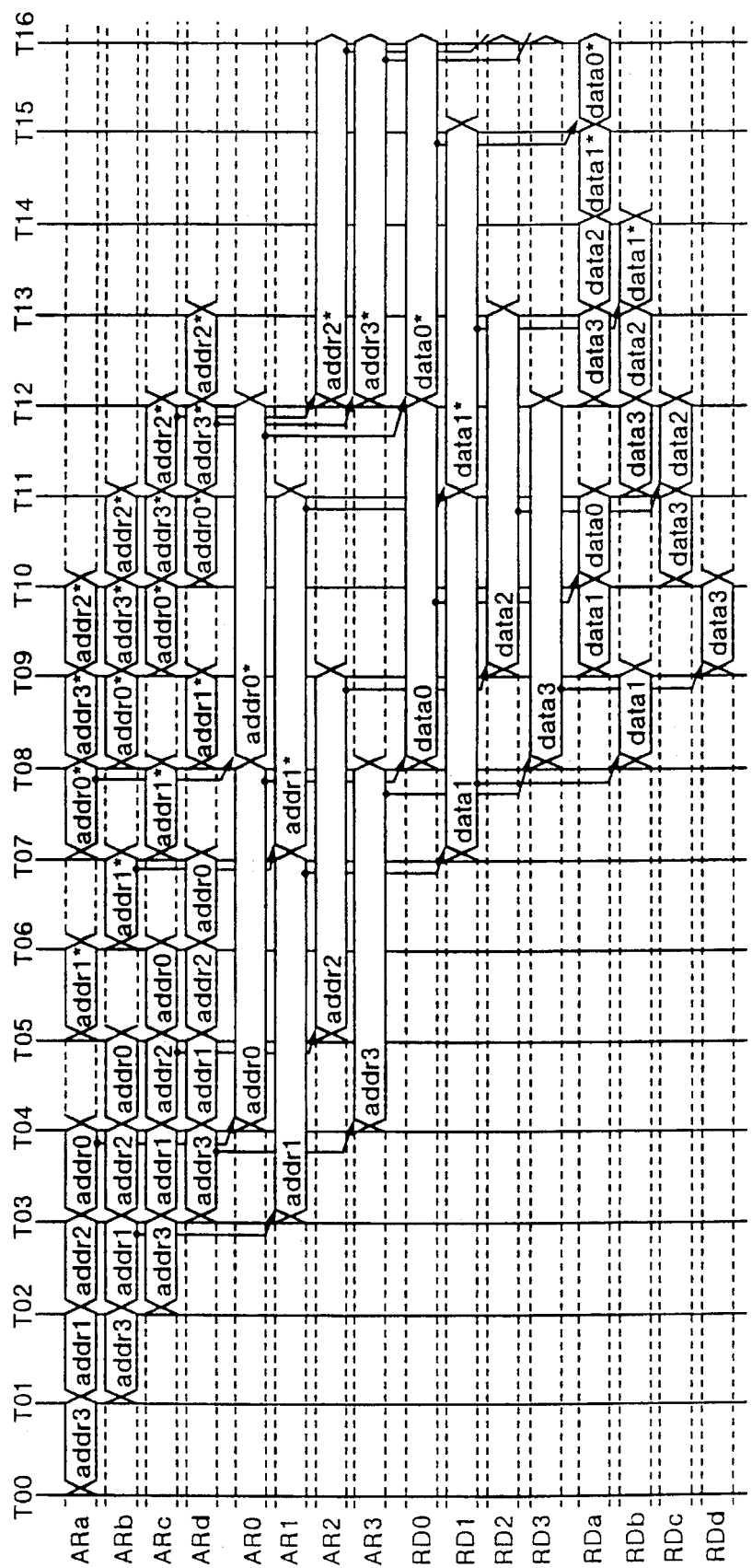
FIG. 8 is a timing chart explaining the operation of randomly reading data from the partial memory group shown in FIG. 4.
Figure 9:
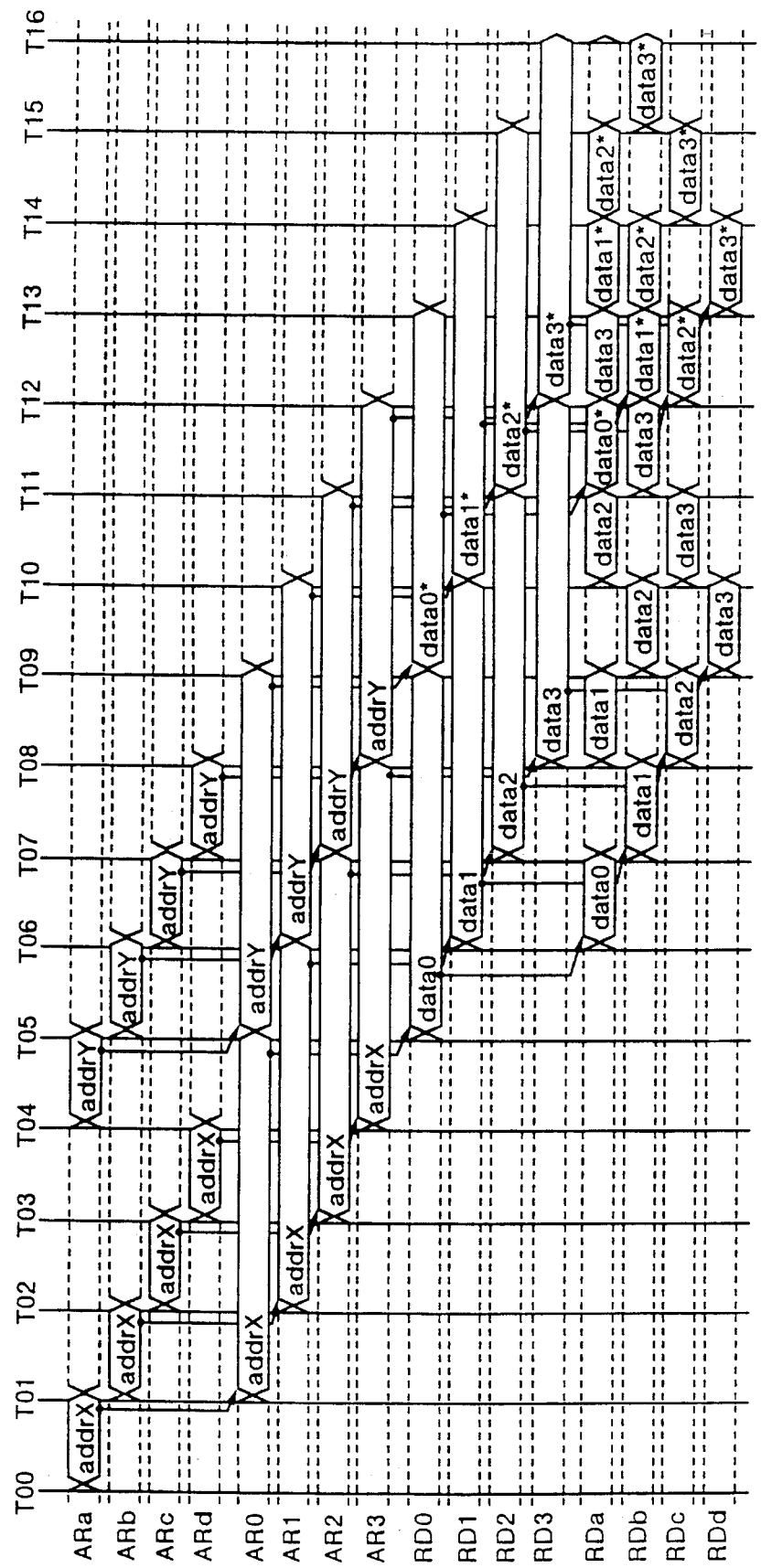
FIG. 9 is a timing chart explaining the operation of collectively reading data from the partial memory group at the same address shown in FIG. 4.
Figure 10:
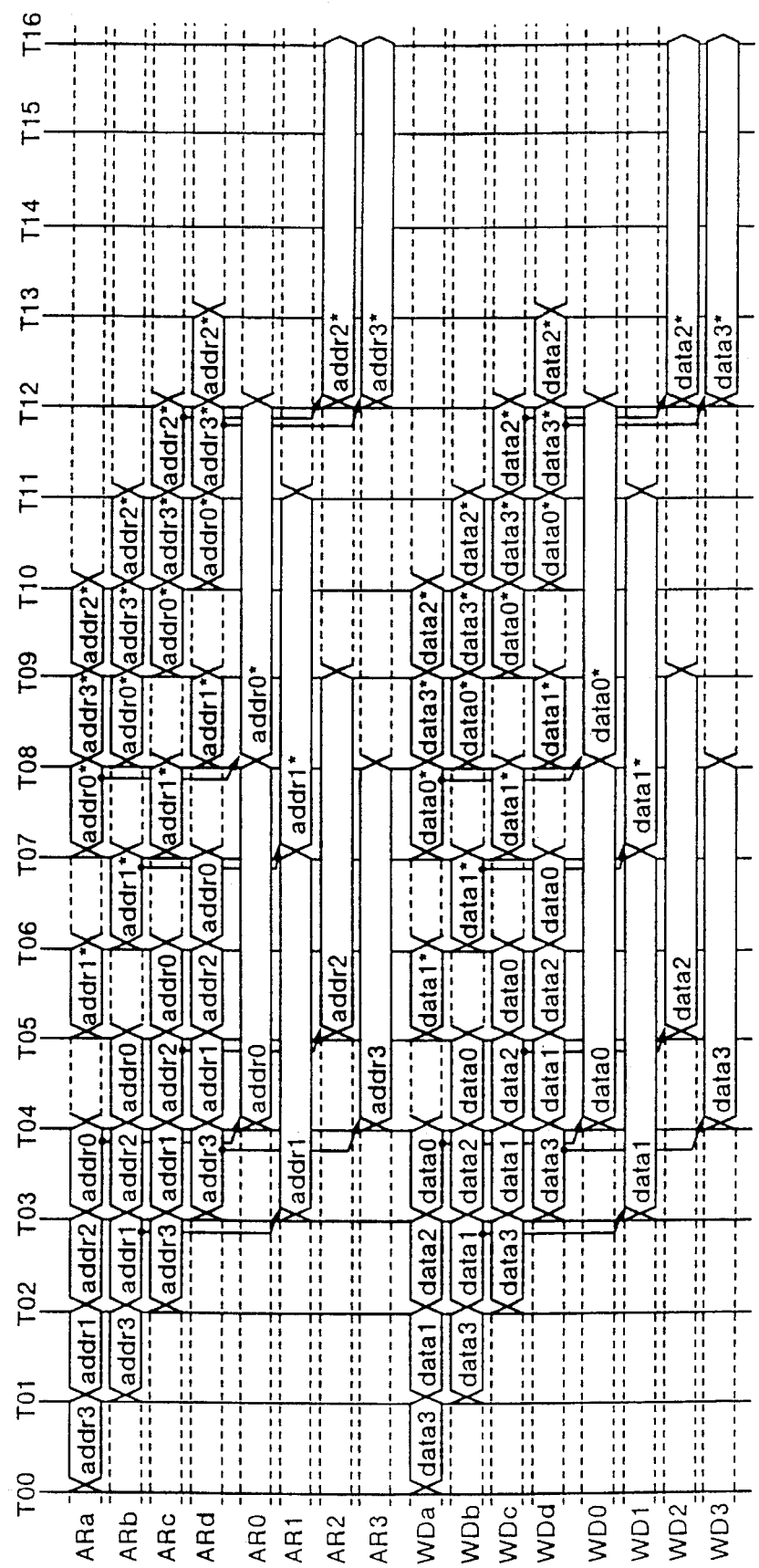
FIG. 10 is a timing chart explaining the operation of randomly writing data into the partial memory group shown in FIG. 4.
Figure 11:
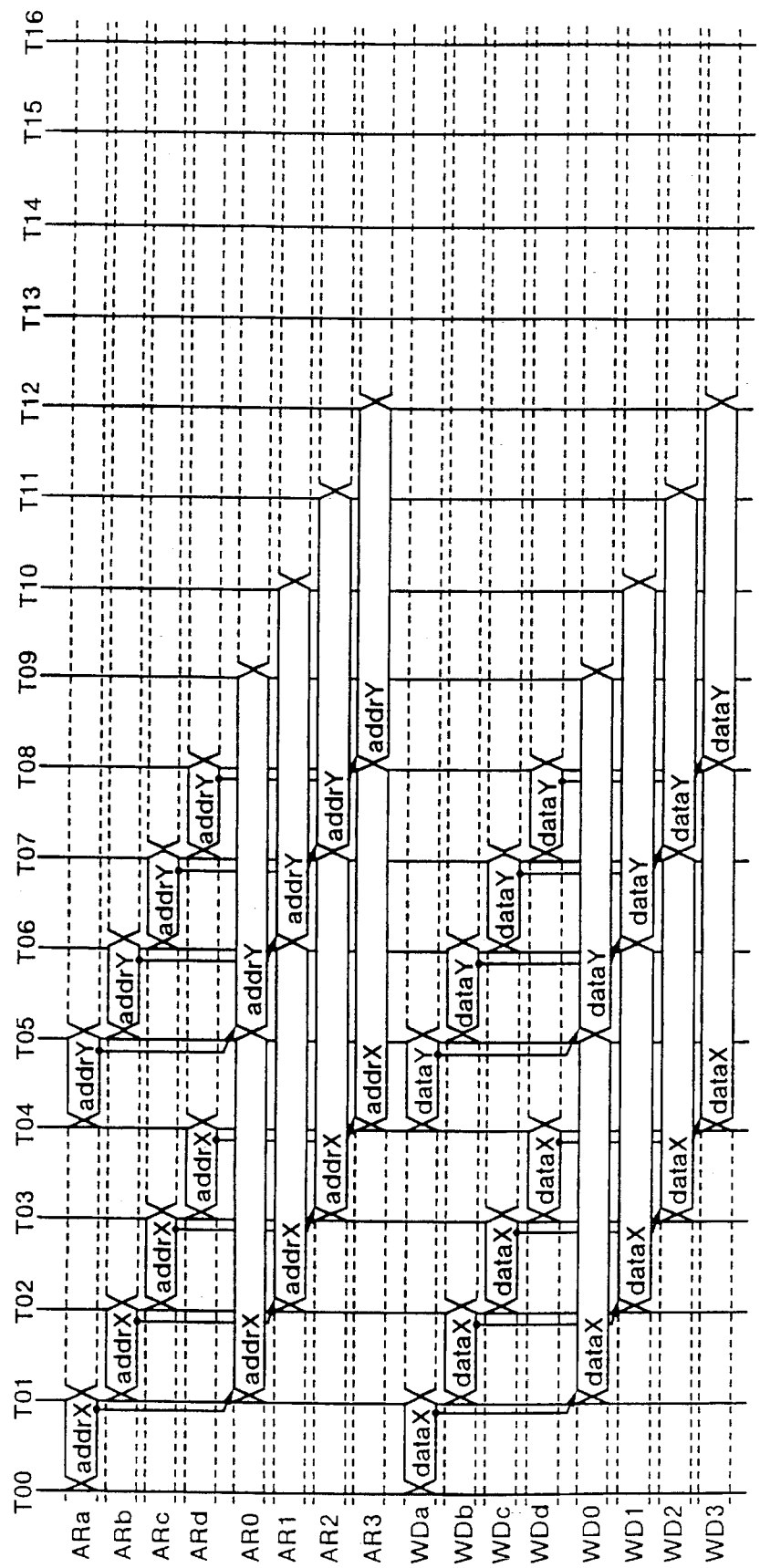
FIG. 11 is a timing chart explaining the operation of collectively writing the same data into the partial memory group at the same address shown in FIG. 4.

FIG. 8 is a timing chart explaining the data read operation in which data is randomly read from an optional partial memory 10 to 13, and FIG. 9 is a timing chart explaining the data read operation in which data is collectively read from all partial memories 10 to 13 at the same address. FIG. 10 is a timing chart explaining the data write operation in which data is randomly written into an optional partial memory 10 to 13, and FIG. 11 is a timing chart explaining the data write operation in which the same data is collectively written in all the partial memories 10 to 13 at the same address.

The ordinates of FIGS. 8 to 11 represent the register names whose symbols correspond to the symbols used in FIG. 7. The abscissas represent a time in terms of machine cycles T00, T01, T02, . . . . Read/write addresses and read/write data transferred by the registers are represented by addr0 and data0 for the partial memory 10, by addr1 and data1 for the partial memory 11, by addr2 and data2 for the partial memory 12, and by addr3 and data3 for the partial memory 13. Read/write addresses and read/write data represented by addrX, addrY, dataX, and dataY are used for all the partial memories 10 to 13. Symbols with an asterisk * indicate the next addresses or data.

As shown in FIGS. 8 to 11, read/write addresses and write data are sequentially transferred to the address registers ARa to ARd and write data registers WDa to WDd by using one machine cycle as one data transfer cycle. As shown in FIGS. 8 to 11, the write addresses and write data are sequentially transferred at the same timings. After the read/write address and write data for each of the partial memories 10 to 13 reached the preceding ones of the address registers ARa to ARd and write data registers WDa to WDd, they are set to the corresponding ones of the internal address registers AR0 to AR3 and internal write data registers WD0 to WD3 at the next machine cycle. In the example shown in FIG. 11, the same data is written in all the partial memories. This operation can be used efficiently, for example, when the contents of all the partial memories are to be cleared to "0".

In this embodiment, the number of partial memory access cycles is assumed to correspond to four machine cycles. It is therefore necessary to hold the read/write addresses and write data set to the internal address registers AR0 to AR3 and internal write data registers WD0 to WD3 during a period of at least four cycles. Accordingly, the read/write address and write data for each partial memory cannot be transferred twice or more during the four cycles. When the read address is set to each internal address register AR0 to AR3, the read data is set to the internal read data register RD0 to RD3 after the four cycles (at the same time, status information is set to the internal status register, although this is not shown in FIGS. 8 to 11). The read data of each partial memory 10 to 11 is transferred from the internal read data register RD0 to RD3 to the next read data register RDa to RDd when there is no conflict relative to the next read data register RDa to RDd. Thereafter, the read data is sequentially transferred through the read data registers RDa to RDd by using one machine cycle as one data transfer cycle.

The transfer direction of the address registers ARa to ARd and write data registers WDa to WDd is opposite to the transfer direction of the read data registers RDa to RDd. This means that the number of access cycles of each partial memory 10 to 13 as viewed from the outside of the memory unit is smallest for the partial memory 10 and largest for the partial memory 13. As a result, the order of sending a read operation start instruction and read address from the outside of the memory unit to each partial memory differs from the order of outputting the read data from the partial memory to the outside of the memory unit. This can be seen from FIGS. 8 to 9.

It is therefore necessary for the external circuit to be provided with a means for establishing a correspondence between outputted read addresses and received read data. Since the number of access cycles of each partial memory is constant and the transfer control logic of the read data controllers 64 and 67 is known, a correspondence can be established by providing the external circuit with a logic simulating the transfer control logic. A correspondence can be established more simply, however, by using the identification information of each partial memory contained in the status information transferred at the same time when the read data is transferred. Specifically, since the order of outputted addresses and the order of received data are definite for each partial memory, a correspondence between outputted addresses and received data can be established for each partial memory by using the identification information of the partial memory.

Next, an operation will be explained wherein a conflict occurs at one or more read data registers RDa to RDd. At time T09 shown in FIG. 8, both the read data data0 in the internal read data register RD0 and the read data1 in the read data register RDb have been prepared for the transfer, so that a conflict relative to the next stage read data register RDa occurs. In this case, therefore, at time T09 the read data data1 having a higher priority is transferred and the read data data0 is suspended. At the next time T10 when the conflict relative to the next stage read data register RDa has been removed, the suspended read data data0 is transferred.

Figure 12:
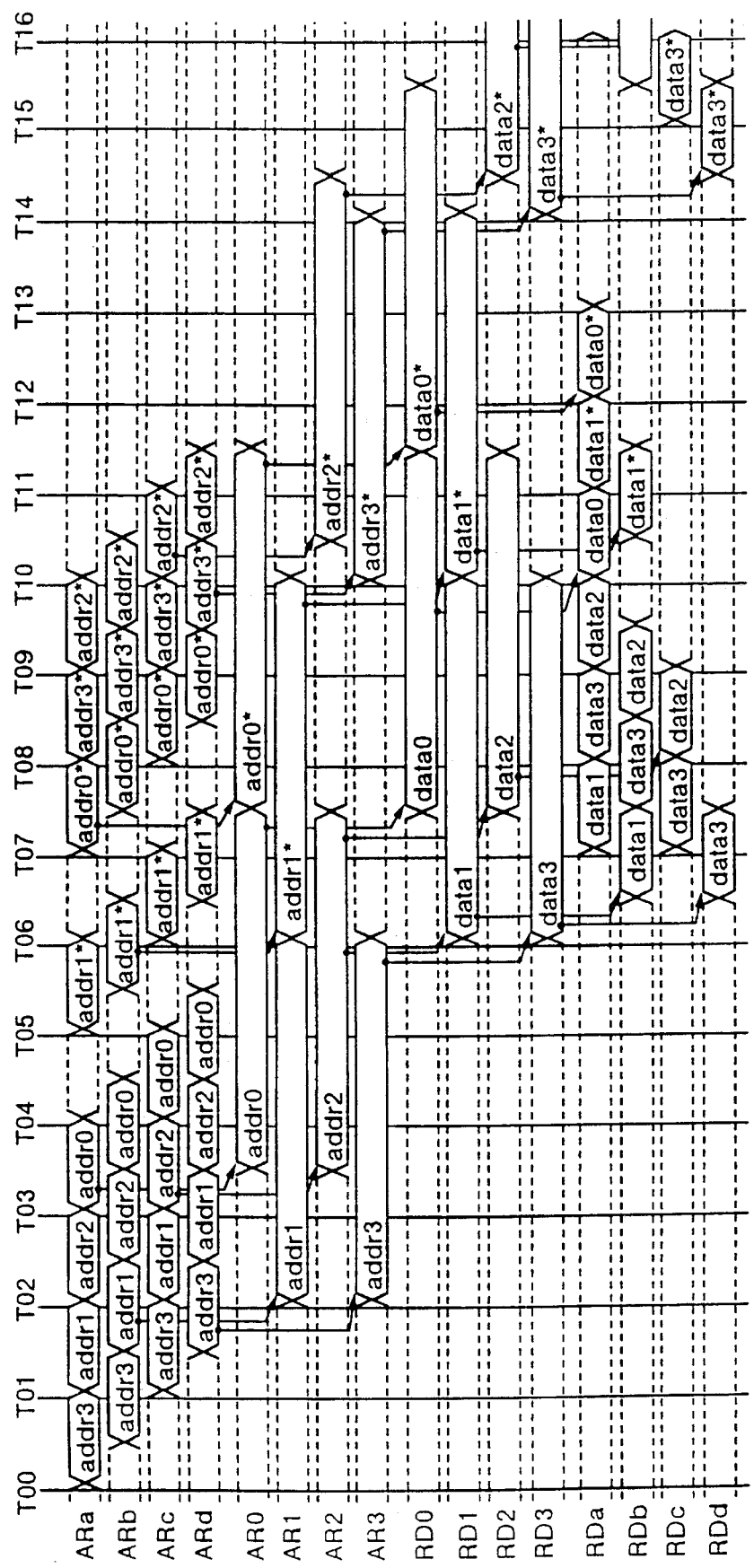
FIG. 12 is a timing chart explaining the operation of randomly reading data from the partial memory group shown in FIG. 4, wherein the data transfer cycle time of the memory is half the machine cycle time.
Figure 13:
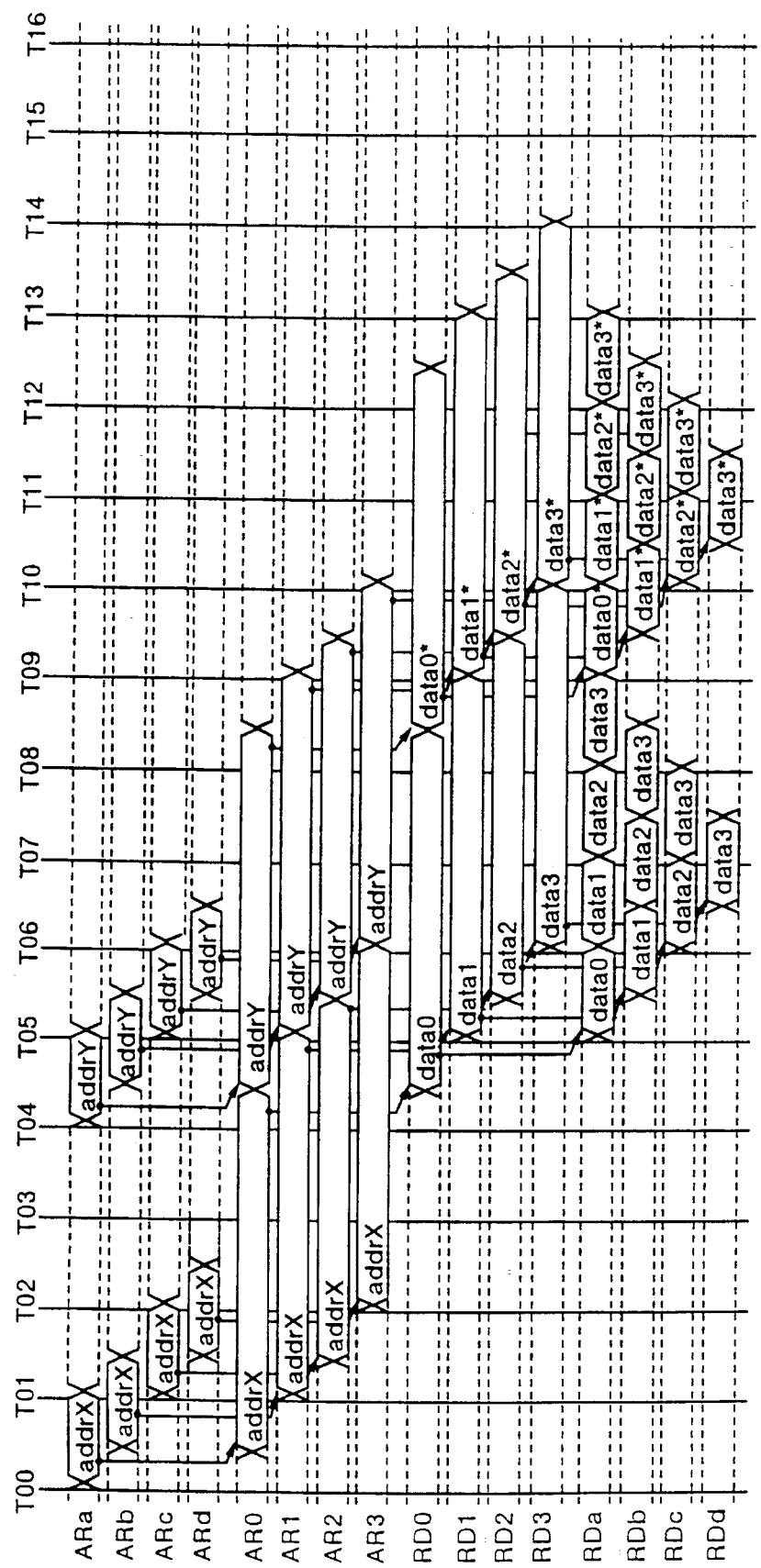
FIG. 13 is a timing chart explaining the operation of collectively reading data from the partial memory group at the same address shown in FIG. 4, wherein the data transfer cycle time of the memory is half the machine cycle time.

FIGS. 12 to 13 are timing charts explaining the operation of the memory unit in which pipeline registers transfer data by using one half machine cycle as one data transfer cycle. This operation may be applied to the case in which Lr<Lm/2 is met, where Lr is a distance between adjacent partial memories 10 to 13 and Lm represents the distance between adjacent pipeline registers. In other words, this operation may be applied to the case in which the distance 2Lr corresponding to two pipeline register stages or between a first pipeline register and a third pipeline register is shorter than Lm, i.e., to the case in which 2Lr<Lm is met.

FIG. 12 is a timing chart explaining the data read operation in which data is randomly read from an optional partial memory 10 to 13, and FIG. 13 is a timing chart explaining the data read operation in which data is collectively read from all partial memories 10 to 13 at the same address.

As seen from FIGS. 12 and 13, read/write addresses and read/write data are sequentially transferred to the address registers ARa to ARd, write registers WDa to WDd, and read data registers RDa to RDd at one half machine cycle time pitch.

Figure 14:
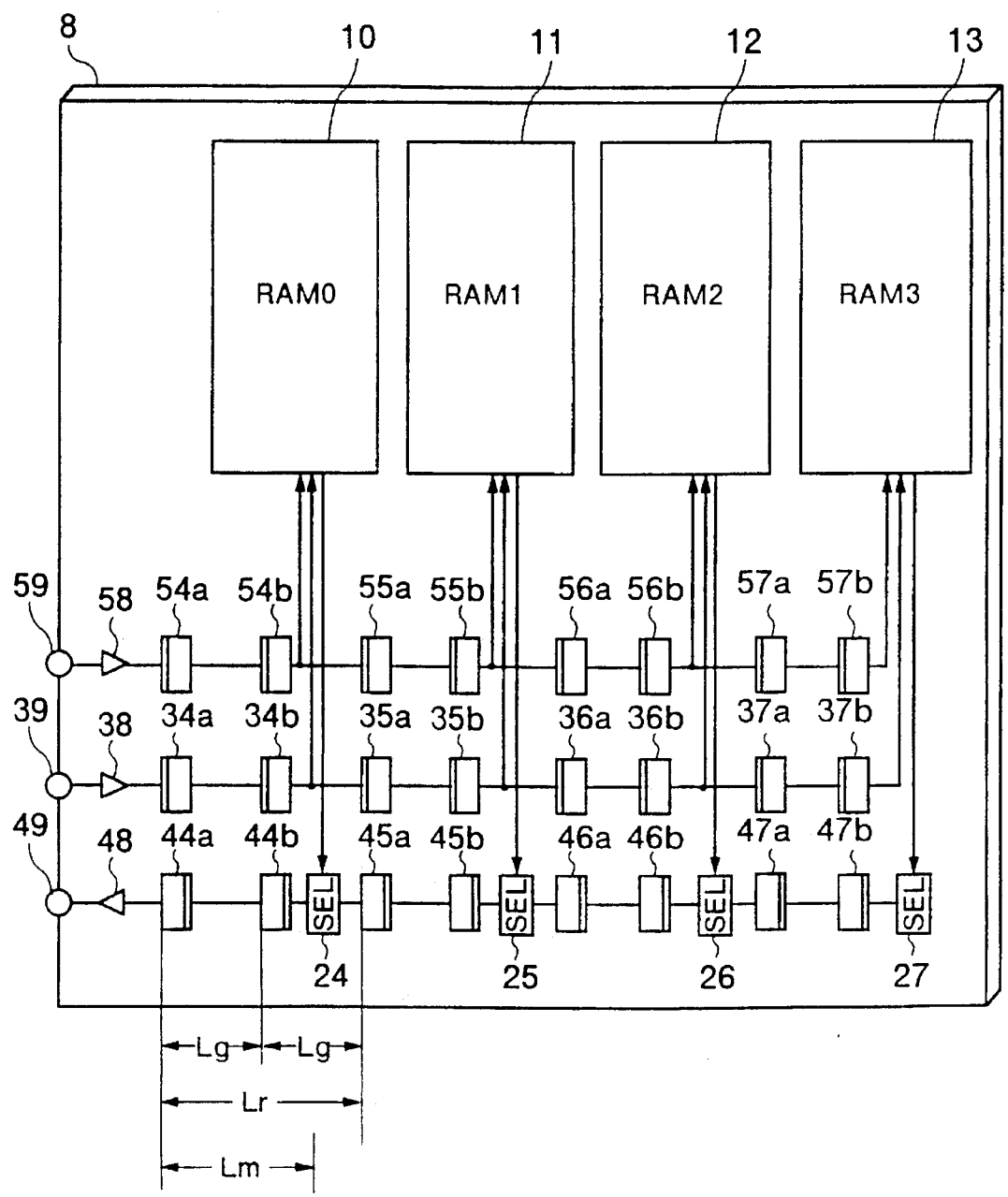
FIG. 14 is a block diagram showing the internal structure of a memory chip incorporating a sequential data transfer scheme according to another embodiment of the invention.

FIG. 14 shows the internal structure of a chip 8 realizing a one chip computer system using a memory of this invention. In the chip of FIG. 14 and other following Figures, control registers are included but are not shown for simplicity of the drawings. In this embodiment, as for the distance Lr between adjacent partial memories, although Lr≦Lm is not met, Lr≦2Lm is met. It is therefore impossible to dispose pipeline registers at the distance Lr. To solve this problem, in addition to registers 34a to 57a corresponding to the pipeline registers 34 to 57 shown in FIG. 2, pipeline registers 34b to 57b are provided so as to set the distance to Lg=Lr/2. The other structures are the same as the computer system chip 2 shown in FIG. 2. The read/write operation of the memory unit is also the same as the computer system chip 2 shown in FIG. 2. In this embodiment, the transfer operation is performed by using two machine cycles as one data transfer cycle.

Figure 15:
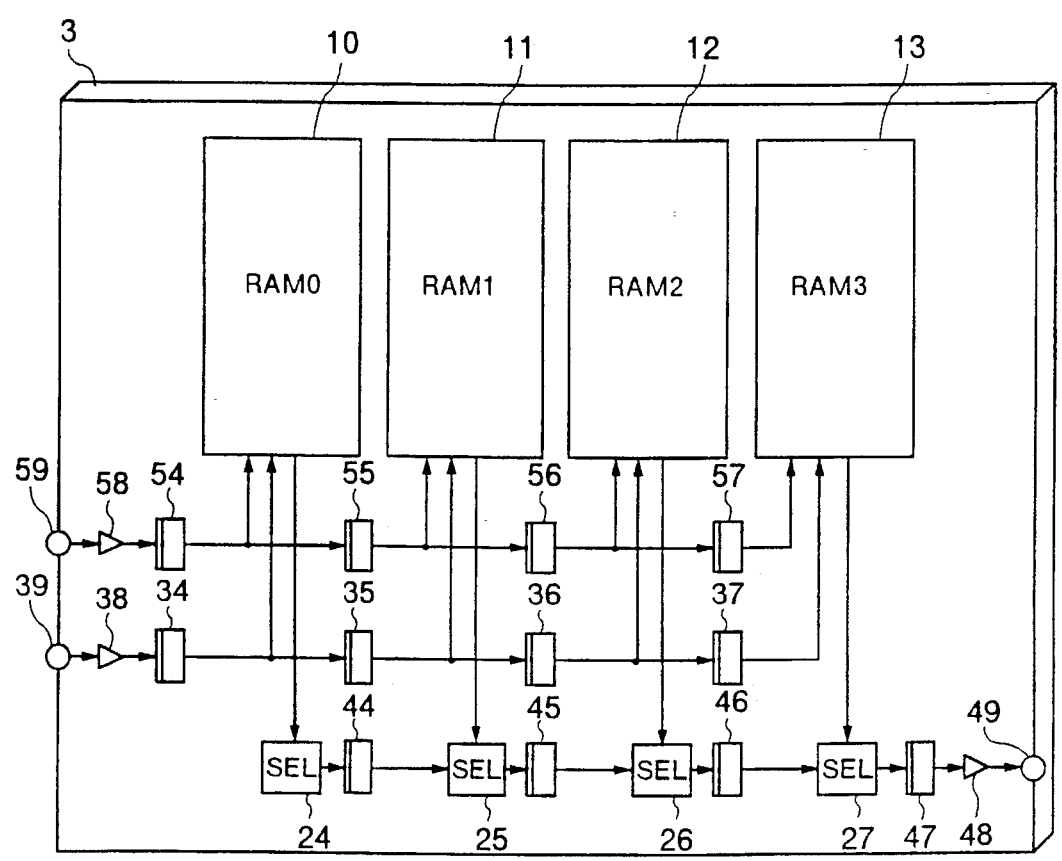
FIG. 15 is a block diagram showing the internal structure of a memory chip incorporating a sequential data transfer scheme according to a further embodiment of the invention.

FIG. 15 shows the internal structure of a memory chip 3 as another example of the memory of this invention. The fundamental elements of the memory chip 3 are the same as the memory chip 1 shown in FIG. 1. Specifically, the memory for storing data is divided into partial memories 10 to 13. Address registers 54 to 57 are the pipeline registers for sequentially transferring addresses from an external signal pin 59 to an input buffer 58 and to the partial memories 10 to 13. Write data registers 34 to 37 are the pipeline registers for sequentially transferring write data from an external signal pin 39 to an input buffer 38 and to the partial memories 10 to 13. Read data registers 44 to 47 are the pipeline registers for sequentially transferring read data from the partial memories 10 to 13 to an output buffer 48 and to an external signal pin 49. Read data selectors 24 to 27 are the selectors for arbitrating conflicts among a plurality of read data. The characteristic feature of this memory chip 3 resides in that the direction of transferring read data is made coincident with the direction of transferring write data.

The outline of the read/write operation of the memory chip 3 is the same as the memory chip 1 shown in FIG. 1, except that the direction of transferring read data is the same as the direction of transferring write data.

Figure 16:
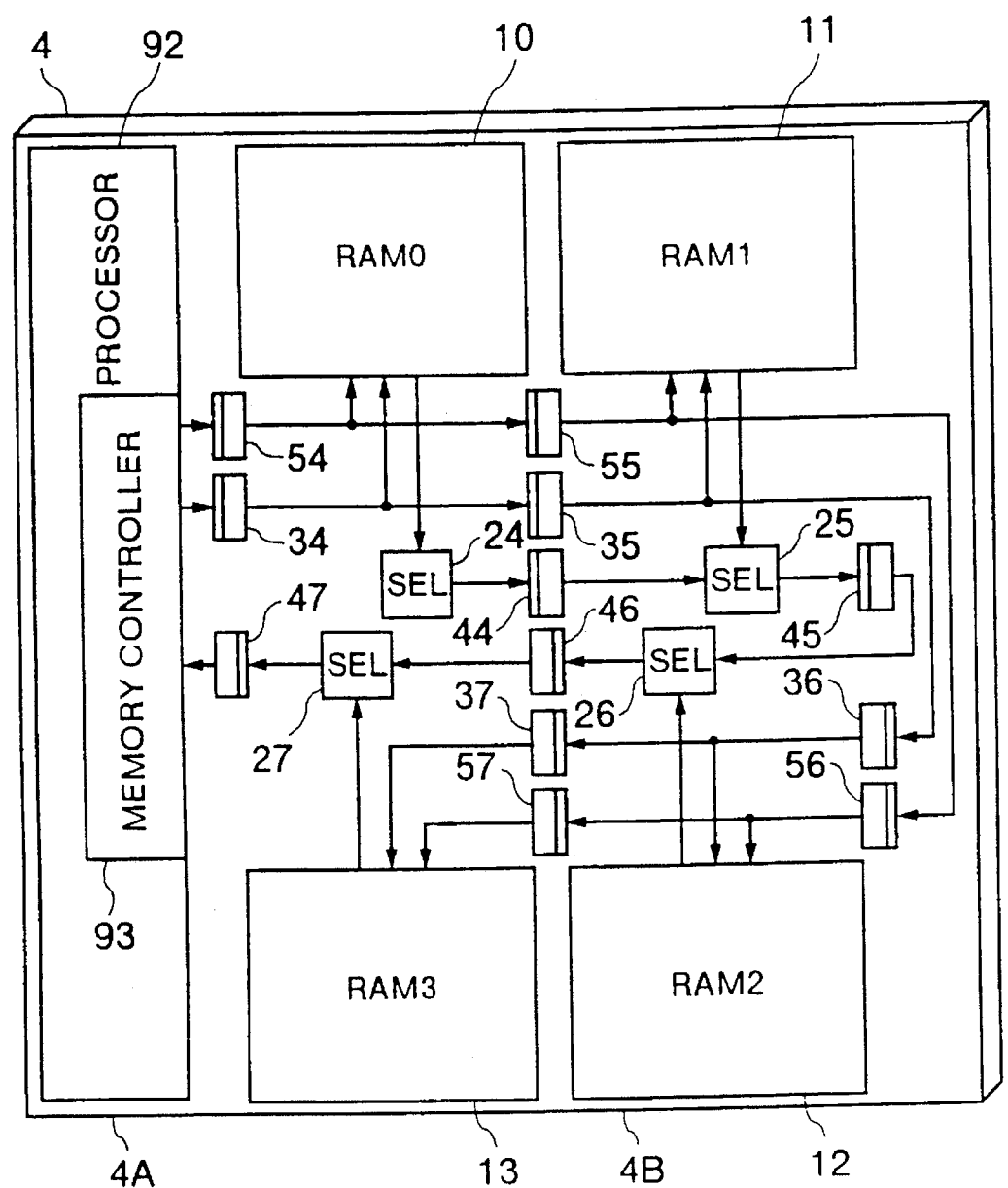
FIG. 16 is a block diagram showing an example of the internal structure of a computer system chip using the memory shown in FIG. 15.

FIG. 16 shows the internal structure of a chip 4 realizing a one chip computer system using the memory shown in FIG. 15. The computer system chip 4 has a processor unit 4A for processing data and a memory unit 4B for storing data. The processor unit 4A has a processor 92 and a memory controller 93. Upon reception of a memory access request such as data read/write request generated by the processor 92, the memory controller 93 generates signals necessary for controlling the memory unit 4B. The memory unit 4B is structured like the memory chip 3 shown in FIG. 15. Specifically, addresses and read/write data are supplied directly to the memory controller 93 without using external signal pins and input/output buffers. Accordingly, the read/write operation of the memory unit 4B as viewed from the memory controller 93 is the same as the memory chip 3 shown in FIG. 15 as viewed from its external signal pins.

Figure 17:
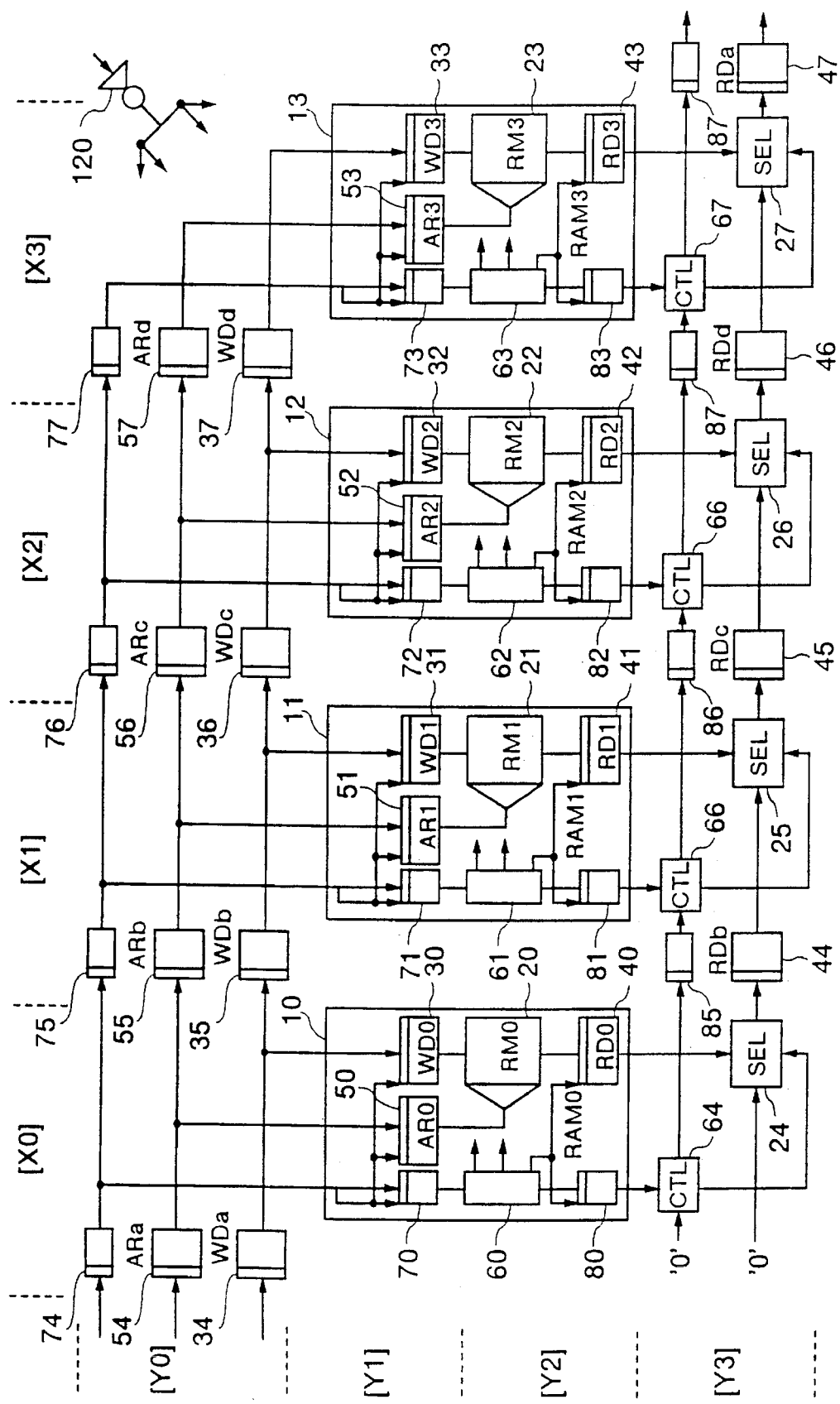
FIG. 17 is a block diagram showing an example of the logical structure of the partial memory group shown in FIG. 15.

FIG. 17 shows the logical structure of the memory chip 3 shown in FIG. 15 and the memory unit 4B of the computer system chip 4 shown in FIG. 16. The fundamental logical elements of the memory unit are the same as the memory unit shown in FIG. 4. Specifically, partial memories are constituted by memory arrays 20 to 23, partial memory controllers 60 to 63, internal address registers 50 to 53, internal write data registers 30 to 33, internal read data registers 40 to 43, internal control registers 70 to 73, and internal status registers 80 to 83. Pipeline registers include address registers 54 to 57, write data registers 34 to 37, read data registers 44 to 47, control registers 74 to 77, and status registers 84 to 87. Read data selectors 24 to 27 and read data controllers 64 to 67 are also provided in order to control the sequential transfer of read data and status information.

The different point between the memory units shown in FIGS. 17 and 4 is the transfer direction of read data and status information. In the memory unit shown in FIG. 17, the transfer direction of read data and status information is the same as the transfer direction of write data. Therefore, the direction and position of the read data registers 44 to 47 after the read data selectors 24 to 27 and the direction and position of the status registers 84 to 87 after the read data controllers 64 to 67 are changed from those shown in FIG. 4. Also in this memory unit, there may occur a conflict at ones of the read data registers 44 to 47 and status registers 84 to 87 because the partial memories 10 to 13 use these registers in common. If a conflict occurs, it can be removed by the same control as the memory unit shown in FIG. 4.

Figure 18:
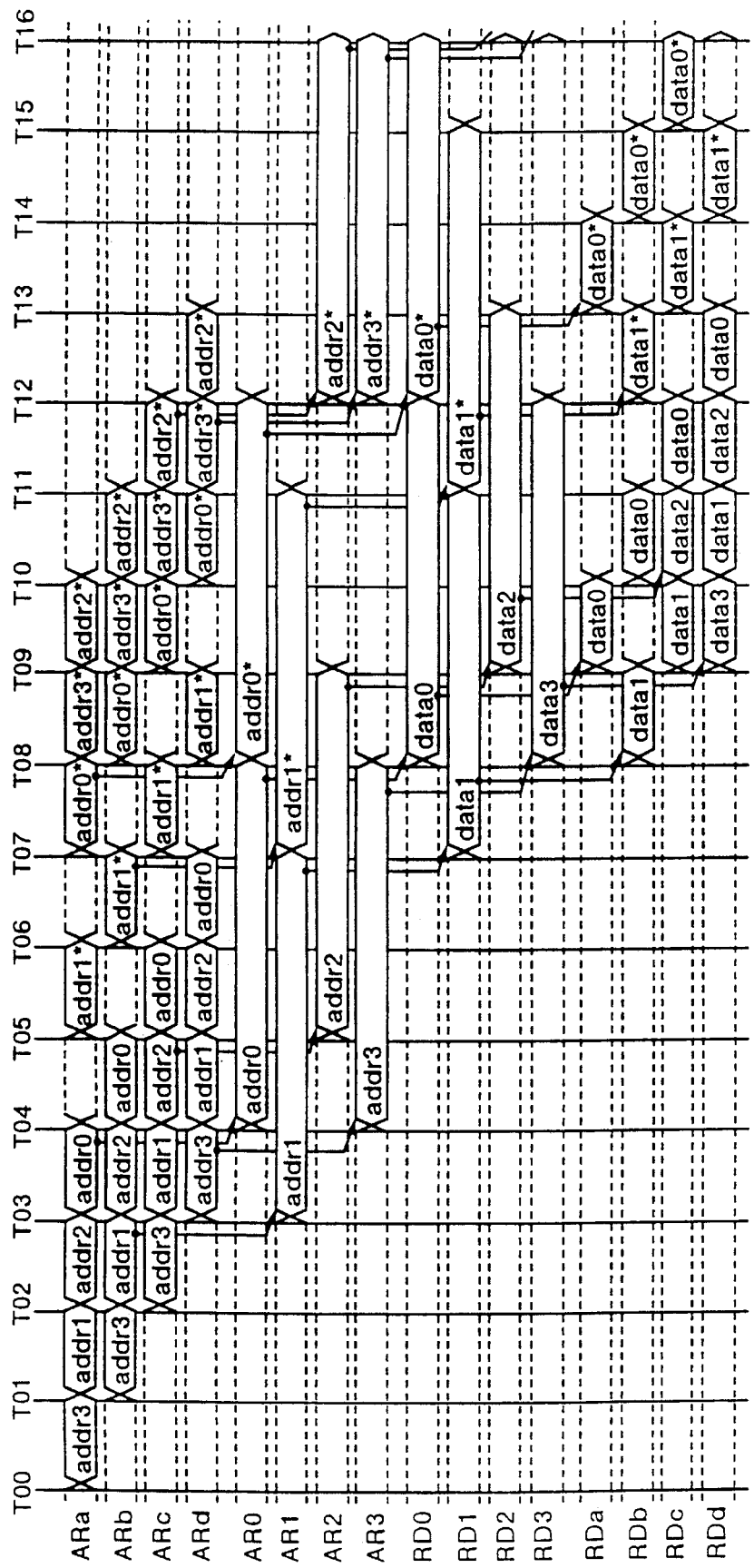
FIG. 18 is a timing chart explaining the operation of randomly reading data from the partial memory group shown in FIG. 17.
Figure 19:
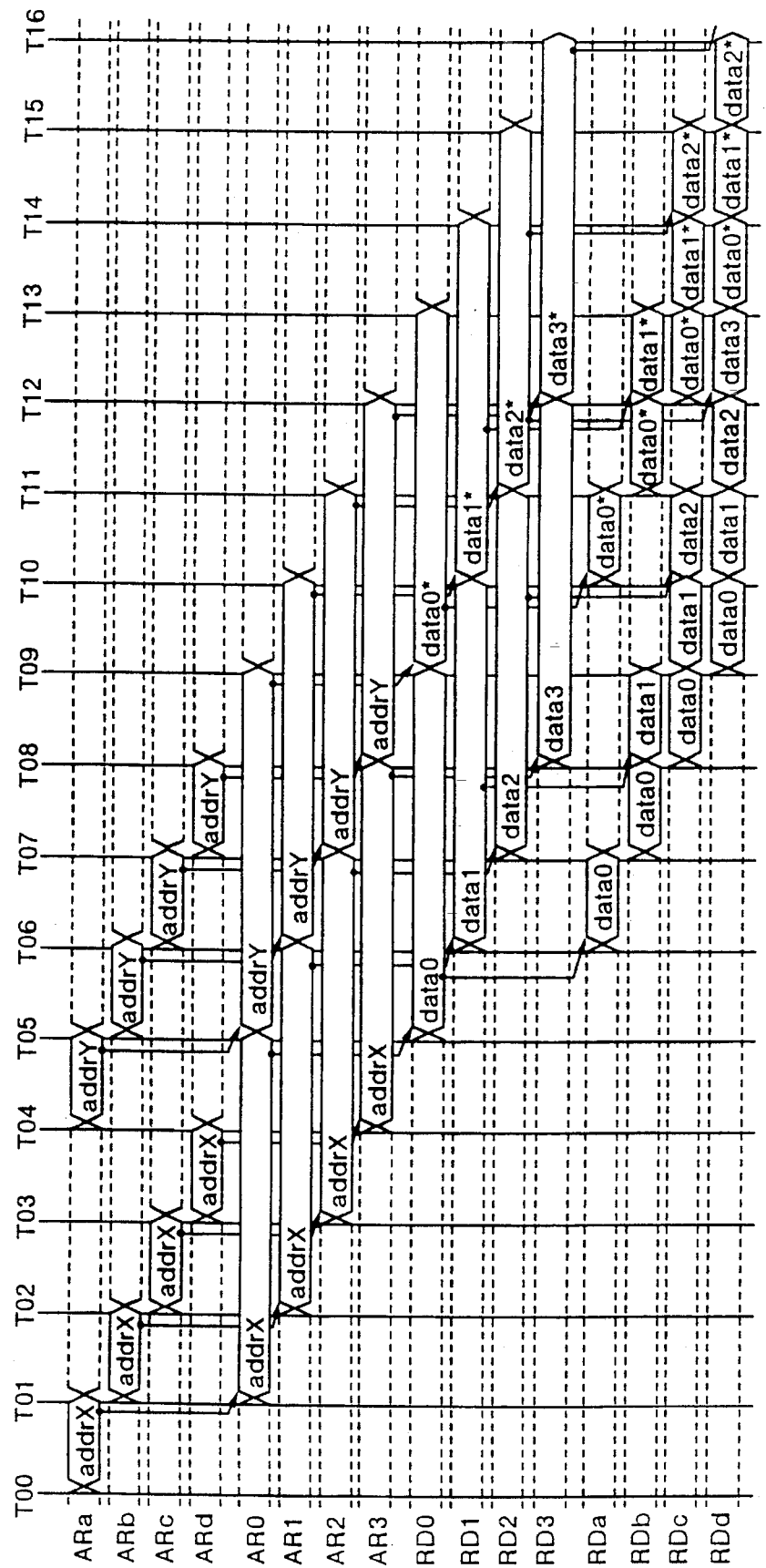
FIG. 19 is a timing chart explaining the operation of collectively reading data from the partial memory group at the same address shown in FIG. 17.

FIGS. 18 and 19 are timing charts explaining the operation of a memory unit wherein each pipeline register transfers data in one data transfer cycle.

Although not shown, it is apparent from the description with FIGS. 12 and 13 that the pipeline registers transfer data by using one half machine cycle as one data transfer cycle.

In FIGS. 18 and 19, the direction of transferring addresses and data through the address registers ARa to ARd and write data registers WDa to WDd is the same as the direction of transferring data through the read data registers RDa to RDd. This means that the number of access cycles is the same at each of the partial memories 10 to 13 as viewed from the outside of the memory unit. As a result, the order of instructing a read operation and sending read addresses to the partial memories from the outside of the memory unit coincides with the order of outputting data from the partial memories to the outside of the memory unit. However, in the case of collectively reading data from all the partial memories 10 to 13 at the same address, the number of access cycles at each of the partial memories 10 to 13 is not the same because a conflict at the read data registers RDa to RDd may occur.

Figure 20:
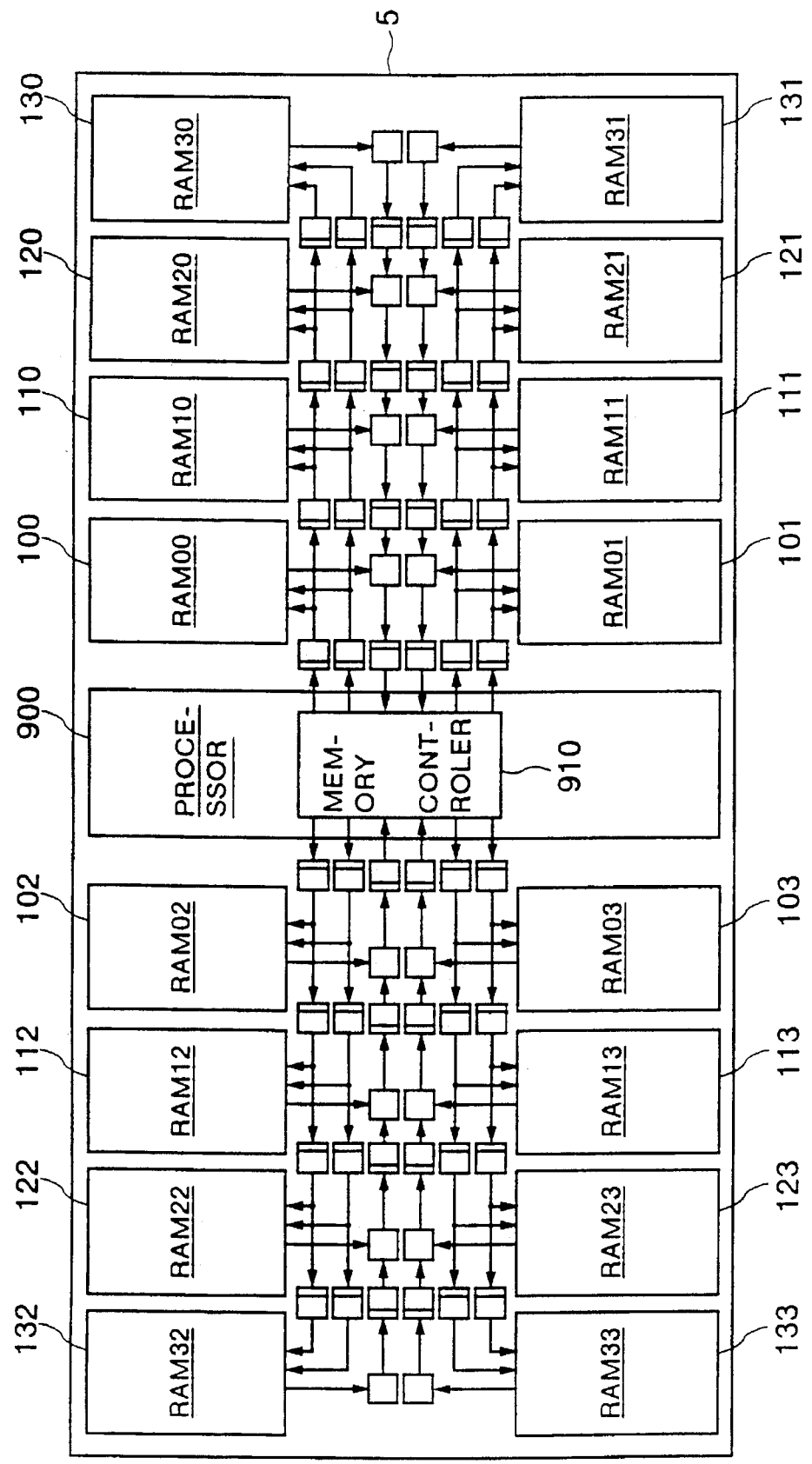
FIG. 20 is a block diagram showing an example of the internal structure of a computer system chip using a plurality of memories of this invention.

FIG. 20 shows the internal structure of a computer system chip 5 using a plurality of memory units of this invention. The computer system chip 5 has a processor unit and a plurality of memory units (four mats). The processor unit has a processor 900 and a memory controller 910. Upon reception of a memory access request such as data read/write request generated by the processor 900, the memory controller 910 generates signals necessary for controlling the memory units. Each memory unit has as its main elements partial memories ln0, ln1, ln2, ln3 (n=0, 1, 2, 3) and is structured like the memory chip 1 shown in FIG. 1.

Figure 21:
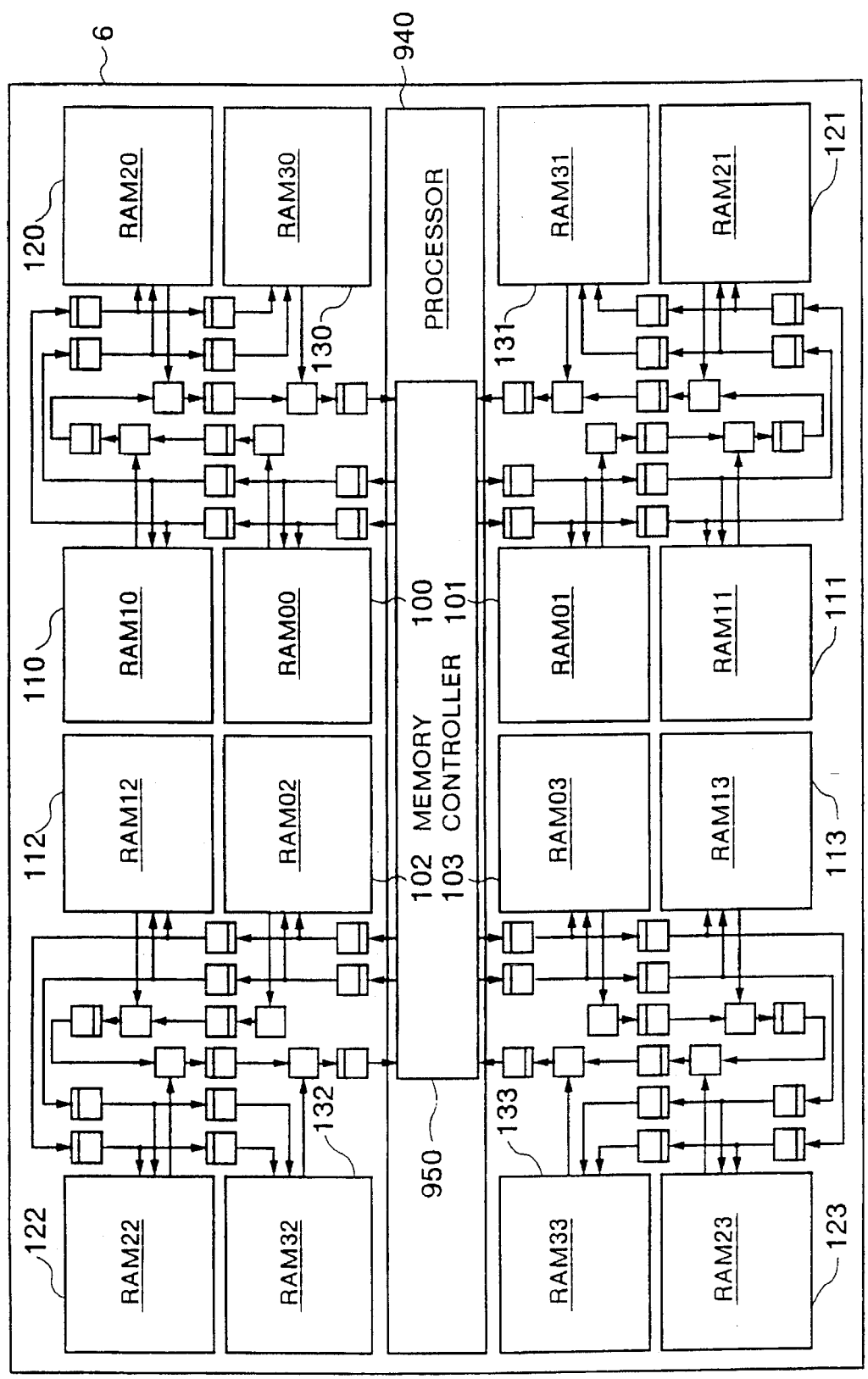
FIG. 21 is a block diagram showing another example of the internal structure of a computer system chip using a plurality of memories of this invention.

FIG. 21 shows the internal structure of a computer system chip 6 using a plurality of memory units of this invention. The computer system chip 6 has a processor unit and a plurality of memory units (four mats). The processor unit has a processor 940 and a memory controller 950. Upon reception of a memory access request such as data read/write request generated by the processor 940, the memory controller 950 generates signals necessary for controlling the memory units. Each memory unit has as its main elements partial memories ln0, ln1, ln2, ln3 (n=0, 1, 2, 3) and is structured like the memory chip 3 shown in FIG. 15.

The memory units shown in FIGS. 20 and 21 can operate independently. For example, an interleaving operation of the memory units between corresponding memory banks can be performed under the controls of the memory controllers 910 and 950.

FIGS. 22A and 22B show examples of physical address allocation of memories of this invention. FIG. 22A shows an example of a physical address allocation suitable for executing a block transfer in which data having a predetermined size is transferred to a memory area and for executing a padding operation of writing same data. For example, assuming that the number of partial memories is four mats and the data width is 16 bytes, data in a 64 byte memory area can be transferred in block by collectively reading the data from all the partial memories at the same address, as illustrated in the timing chart of FIG. 9, or alternatively a padding operation of writing same data to a 64 byte memory area by collectively writing the same data to all the partial memories at the same address, as illustrated in the timing chart of FIG. 11.

FIG. 22B shows an example of a physical address allocation suitable for reducing the number of access cycles of a particular logical page in a virtual storage system. The numbers of access cycles of partial memories are different if the transfer direction of read addresses is opposite to the transfer direction of read data. In such a case, the number of access cycles of a logical page can be reduced by allocating physical addresses at least greater than a logical page to each partial memory and mapping a particular logical page to a physical page assigned a partial memory having a smaller number of access cycles.

As another embodiment of this invention, in a computer system in which the distance Lr between a processor and a memory is longer than the maximum signal transferable distance Lm in one machine cycle (Lr>Lm), registers are disposed at the interval of the distance smaller than Lm on the transfer path of the computer system. In this case, since the distance between the processor and the memory is long, data and signals are sequentially transferred via the registers in each machine cycle. This embodiment can also have the same advantageous effects as the case where data is transferred to and from a plurality of partial memories.

What is claimed is:

1. A memory comprising:

a plurality of partial memories;

at least one first temporary storage means provided for each of said partial memories for supplying an address from outside of said memory to a corresponding one of said partial memories, said first temporary storage means provided for said partial memories being connected in series;

at least one second temporary storage means provided for each of said partial memories for supplying input data from outside of said memory to a corresponding one of said partial memories, said second temporary storage means provided for said partial memories being connected in series;

at least one third temporary storage means provided for each of said partial memories for receiving output data from a corresponding one of said partial memories and outputting said output data to outside of said memory, said third temporary storage means provided for said partial memories being connected in series; and means for supplying a clock signal to said first, second, and third temporary storage means;

wherein in each of said first, second, and third temporary storage means, a distance between two adjacent temporary storage means is shorter than a maximum distance which contents in each of said temporary storage means can travel in a machine cycle time defined by a clock supplied from said clock supplying means, and in each of said first, second, and third temporary storage means, contents stored in each of said temporary storage means are transferred to a next temporary storage means in every machine cycle as one data transfer time.

2. A memory according to claim 1, wherein said partial memories, said first, second, and third temporary storage means are fabricated on a semiconductor chip.

3. A memory according to claim 2, wherein a plurality of sets each have substantially the same assembly shape, each said set including each said partial memory and corresponding ones of said first, second, and third temporary storage means.

4. A memory according to claim 1, further comprising a plurality of fourth temporary storage means provided for each of said partial memories for supplying a control signal from the outside of said memory to a corresponding one of said plurality of partial memories, said plurality of second temporary storage means being connected in series, and said control signal controlling said corresponding one of said plurality of partial memories.

5. A memory according to claim 4, further comprising a plurality of fifth temporary storage means provided for each of said plurality of partial memories for receiving a status signal from a corresponding one of said plurality of partial memories and outputting said status signal to the outside of said memory, said plurality of fifth temporary storage means being connected in series.

6. A memory according to claim 5, further comprising a selector provided between each of said third temporary storage means and a corresponding one of said partial memories, said selector selecting one of said output data from said corresponding one of said partial memories and said output data from a preceding one of said third temporary storage means.

7. A memory according to claim 6, further comprising selector instructing means provided between each of said fifth temporary storage means and a corresponding one of said partial memories, said selector instructing means judging, from said status signal from said corresponding one of said partial memories and said status signal from a preceding one of said fifth temporary storage means, whether said output data from said corresponding one of said partial memories conflicts with said output data from a preceding one of said third temporary storage means, and if there is a conflict, instructing a corresponding one of said selectors which one of said two output data to select.

8. A memory according to claim 7, wherein if there is a conflict, said selector instructing means instructs said corresponding one of said selectors to preferentially select said output data from said preceding one of said third temporary storage means.

9. A memory according to claim 2, wherein directions of transferring data from said first, second, and third temporary storage means are the same on said semiconductor chip on which said first, second, and third temporary storage means are fabricated.

10. A memory according to claim 2, wherein a direction of transferring data from said third temporary storage means is different from directions of transferring data from said first and second temporary storage means, on said semiconductor chip on which said first, second, and third temporary storage means are fabricated.

11. A memory according to claim 1, wherein an address supplied from the outside of said memory to said first temporary storage means contains a first signal for designating one of said plurality of partial memories and a second signal for designating a location in said designated partial memory, and whereby random addresses are sequentially supplied from the outside of said memory to said first temporary storage means and to designated partial memories, and the random output data corresponding to said random addresses are read from said designated partial memories.

12. A memory according to claim 1, wherein an address supplied from the outside of said memory to said first temporary storage means contains a first signal for designating at least two of said plurality of partial memories and a second signal for designating a location in said designated partial memories, and whereby a same address is supplied from the outside of said memory to said first temporary storage means and to at least two designated partial memories, and at least two output data are read from said at least two designated partial memories at said same address.

13. A memory according to claim 1, wherein an address supplied from the outside of said memory to said first temporary storage means contains a first signal for designating all of said plurality of partial memories and a second signal for designating a location in said designated partial memories, and whereby a same address is supplied from the outside of said memory to said first temporary storage means and to all of said designated partial memories, and output data are read from all of said designated partial memories at said same address.

14. A memory according to claim 1, wherein an address supplied from the outside of said memory to said first temporary storage means contains a first signal for designating one of said plurality of partial memories and a second signal for designating a location in said designated partial memory, and whereby random addresses are sequentially supplied from the outside of said memory to said first temporary storage means and to designated partial memories, random input data corresponding to said random addresses are supplied from the outside of said memory to said second temporary storage means and to said designated partial memories to be written into said designated partial memories.

15. A memory according to claim 1, wherein an address supplied from the outside of said memory to said first temporary storage means contains a first signal for designating at least two of said plurality of partial memories and a second signal for designating a location in said designated partial memories, and whereby a same address is supplied from the outside of said memory to said first temporary storage means and to designated partial memories, same input data is supplied from the outside of said memory to said second temporary storage means and to at least two said designated partial memories, and said same input data is written into at least two said designated partial memories at said same address.

16. A memory according to claim 1, wherein an address supplied from the outside of said memory to said first temporary storage means contains a first signal for designating all of said plurality of partial memories and a second signal for designating a location in said designated partial memories, and whereby a same address is supplied from the outside of said memory to said first temporary storage means and to all said designated partial memories, a same input data is supplied from the outside of said memory to said second temporary storage means and to all said designated partial memories, and said same input data is written in all said designated partial memories at said same address.

17. A memory according to claim 1, wherein said first, second, and third temporary storage means are each provided with a plurality of temporary storage means.

18. A memory comprising:

a plurality of partial memories;

a plurality of first temporary storage means provided for each of said plurality of partial memories for supplying an address from an outside of said memory to a corresponding one of said plurality of partial memories, said plurality of first temporary storage means being connected in series;

a plurality of second temporary storage means provided for each of said plurality of partial memories for supplying input data from the outside of said memory to a corresponding one of said plurality of partial memories, said plurality of second temporary storage means being connected in series;

a plurality of third temporary storage means provided for each of said plurality of partial memories for receiving output data from a corresponding one of said plurality of partial memories and outputting said output data to the outside of said memory, said plurality of third temporary storage means being connected in series; and means for supplying a clock signal to said plurality of first, second, and third temporary storage means;

wherein, in each of said first, second and third temporary storage means, a distance between three consecutive temporary storage means is shorter than a maximum distance by that contents stored in each temporary storage means can travel in a machine cycle time defined by a clock supplied from said clock supplying means, and in each of said first, second and third temporary storage means, contents stored in each temporary storage means are transferred to a next temporary storage means, through said second temporary storage means, and through said third temporary storage means, in every half a machine cycle as one data transfer time.

19. A memory comprising:

a plurality of partial memories:

a plurality of first temporary storage means provided for each of said plurality of partial memories for supplying an address from an outside of said memory to a corresponding one of said plurality of partial memories, said plurality of first temporary storage means being connected in series;

a plurality of second temporary storage means provided for each of said plurality of partial memories for supplying input data from the outside of said memory to a corresponding one of said plurality of partial memories, said plurality of second temporary storage means being connected in series;

a plurality of third temporary storage means provided for each of said plurality of partial memories for receiving output data from a corresponding one of said plurality of partial memories and outputting said output data to the outside of said memory, said plurality of third temporary storage means being connected in series; and means for supplying a clock signal to said plurality of first, second, and third temporary storage means;

wherein, in each of said first, second and third temporary storage means, contents stored in each temporary storage means are transferred to a next temporary storage means in every machine cycle time as a data transfer time, said machine cycle being defined by a clock supplied from said clock supplying means, and an access time to each said partial memory is longer than one data transfer cycle time, and shorter than a time of said one data transfer cycle time multiplied by the number of said plurality of partial memories.

20. A processor system comprising:

a processor; and at least one memory connected to said processor, said at least one memory comprising:

a plurality of partial memories:

a plurality of first temporary storage means provided for each of said plurality of partial memories for supplying an address from said processor to a corresponding one of said plurality of partial memories, said plurality of first temporary storage means being connected in series;

a plurality of second temporary storage means provided for each of said plurality of partial memories for supplying input data from said processor to a corresponding one of said plurality of partial memories, said plurality of second temporary storage means being connected in series;

a plurality of third temporary storage means provided for each of said plurality of partial memories for receiving output data from a corresponding one of said plurality of partial memories and outputting said output data to said processor, said plurality of third temporary storage means being connected in series; and means for supplying a clock signal to said plurality of first, second, and third temporary storage means;

wherein, in each of said first, second and third temporary storage means, a distance between two adjacent temporary storage means is shorter than a maximum distance by that contents in each temporary storage means can travel in a machine cycle time defined by a clock supplied from said clock supplying means, and in each of said first, second and third temporary storage means, contents stored in each temporary storage means are transferred to a next temporary storage means in every machine cycle as one data transfer time.

21. A processor system according to claim 20, wherein said processor and said memory are assembled on a semiconductor chip.

22. A computer system comprising:

a processor for processing data;

a memory for storing said data; and a transfer path provided between said processor and said memory for transferring input/output data and a signal relative to said memory at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time.

23. A computer system comprising:

a processor for processing data;

a memory for storing said data; and a transfer path provided between said processor and said memory for transferring input/output data and a signal relative to said memory at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time, and said memory is divided into a plurality of partial memories, and includes control means for controlling a read/write operation of said input/output data to and from each said partial memory by shifting said input/output data and said signal at intervals of said data transfer cycle time on said storage means.

24. A memory system comprising:

a memory for storing data; and a transfer path for transferring input/output data and a signal relative to said memory at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time, and said memory includes control means for controlling a read/write operation of said input/output data so as to match a transfer cycle of said input/output data and said signal on said transfer path and in said memory.

25. A memory comprising:

a plurality of partial memories for storing data; and a transfer path for transferring input/output data and a signal relative to each of said partial memories at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time.

26. A memory comprising:

a plurality of partial memories for storing data; and a transfer path for transferring input/output data and a signal relative to each of said partial memories at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time, and each said partial memory includes control means for controlling a read/write operation of said input/output data to and from each said partial memory by shifting said input/output data and said signal at intervals of said data transfer cycle time on said storage means, and for generating status information of the read/write of said input/output data.

27. A memory comprising:

a plurality of partial memories for storing data; and a transfer path for transferring input/output data and a signal relative to each of said partial memories at intervals of data transfer cycle time; and a clock supply system, wherein said transfer path comprises:

a plurality of storage means for temporarily storing said input/output data and said signal, said plurality of storage means being disposed at an interval of a distance which said input/output data and said signal can travel in a machine cycle time defined by a clock supplied from said clock supply system.

28. A memory according to claim 27, wherein:

the distance between any two adjacent partial memories is a distance which said input/output data can travel in one machine cycle time, and each of said plurality of storage means is provided for each of said partial memories.

29. A memory according to claim 27, wherein:

the distance between any two adjacent partial memories is a distance over which said input/output data can travel in two or more machine cycles, and said plurality of storage means are provided for each of said partial memories.

30. A memory chip wherein the memory according to claim 27 is fabricated on one chip.

31. A computer system comprising:

a processor for processing data;

a plurality of partial memories for storing said data; and a transfer path provided between said processor and each said partial memory, said transfer path transferring input/output data and a signal relative to each of said partial memories at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time.

32. A computer system chip for a computer system having a processor for processing data and a memory for storing said data, the computer system using the memory according to claim 27 is used as the whole or part of a memory of the computer system, wherein the computer system is fabricated on one chip.

33. A computer system comprising:

a processor for processing data;

a plurality of partial memories for storing said data; and a transfer path provided between said processor and each of said partial memories, said transfer path transferring input/output data and a signal relative to each of said partial memories at intervals of data transfer cycle time, wherein said transfer path comprises:

a plurality of storage means for temporarily storing said input/output data and said signal, said plurality of storage means being disposed at an interval of a distance which said input/output data and said signal can travel in a data transfer cycle time; and driving means for driving said storage means at intervals of said data transfer cycle time.

34. A computer system comprising:

a processor for processing data;

a plurality of partial memories for storing said data; and a transfer path provided between said processor and each said partial memory, said transfer path transferring input/output data and a signal relative to each of said partial memories at intervals of data transfer cycle time, wherein said transfer path comprises:

a plurality of storage means for temporarily storing said input/output data and said signal, said plurality of storage means being disposed at an interval of a distance which said input/output data and said signal can travel in said data transfer cycle time; and driving means for driving said storage means at intervals of said data transfer cycle time, and each said partial memory includes control means for controlling a read/write operation of said input/output data to and from each said partial memory so as to match said data transfer cycle time on said transfer path, and for generating status information of the read/write of said input/output data.

35. A computer system comprising:

a processor for processing data;

a plurality of partial memories for storing said data; and a transfer path for transferring input/output data and a signal relative to each of said partial memories at intervals of data transfer cycle time; and a clock supply system, wherein said transfer path comprises a plurality of storage means being disposed at an interval of a distance which said input/output data and said signal can travel in one machine cycle time, and said clock supply system includes means for supplying a same clock to all said storage means.

36. A computer system according to claim 32, wherein said means for supplying a same clock includes a clock driver disposed in each small area of a plurality of small areas divided from said partial memories, each said clock driver supplying said same clock to each said storage means in each said small area.

37. A computer system comprising:

a processor for processing data;

a plurality of partial memories for storing said data; and a transfer path for transferring input/output data and a signal relative to each said partial memory, wherein said transfer path comprises a plurality of storage means being disposed at an interval of a distance which said input/output data and said signal can reach in one machine cycle time, and each said storage means comprises:

a control register for holding and sequentially transferring control information for controlling a read/write operation of each said partial memory;

an address register for holding and sequentially transferring an address to each said partial memory;

a write data register for holding and sequentially writing data to each said partial memory;

a status register for holding and sequentially transferring status information of the status of the read/write operation; and a read data register for holding and sequentially transferring read data from each said partial memory, and each said transfer path includes a read data selector for removing a conflict at said read data register between a plurality of read data.

38. A computer system according to claim 37, wherein each said partial memory including a memory array comprises:

an internal address register for holding an address of each said memory array;

an internal write data register for holding said write data;

an internal read data register for holding said read data;

an internal control register for receiving the control information from said control register; and a partial memory controller for controlling the read/write operation of each said partial memory in accordance with the control information and for generating status information and setting the status information to an internal status register.

39. A data transfer method for a computer system having a processor for processing data, a memory for storing the data, and a transfer path provided between the processor and the memory for transferring input/output data and a signal relative to the memory at intervals of data transfer cycle time, wherein said input/output data and said signal are sequentially transferred through a plurality of storage means being disposed on said transfer path at an interval of a distance which said input/output data and said signal can travel in said data transfer cycle time.

40. A data transfer method for a computer system having a processor for processing data, a memory for storing the data, and a transfer path provided between the processor and the memory for transferring input/output data and a signal relative to the memory at intervals of data transfer cycle time, wherein said input/output data and said signal are sequentially transferred through a plurality of storage means being disposed on said transfer path at an interval of a distance which said input/output data and said signal can travel in said data transfer cycle time, and a read/write operation of said input/output data to and from said memory is executed at a timing of said data transfer cycle time.

41. A data transfer method for a memory system having a memory for storing data and a transfer path for transferring input/output data and a signal relative to the memory at intervals of data transfer cycle time, wherein said input/output data and said signal are sequentially transferred through a plurality of storage means being disposed on said transfer path at an interval of a distance which said input/output data and said signal can travel in said data transfer cycle time.

42. A data transfer method for a memory system having a plurality of partial memories for storing data and a transfer path for transferring input/output data and a signal relative to each of said partial memories at intervals of data transfer cycle time, wherein said input/output data and said signal are sequentially transferred through a plurality of storage means being disposed on said transfer path at an interval of a distance which said input/output data and said signal can travel in said data transfer cycle time.

43. A data transfer method for a memory system having a plurality of partial memories for storing data, a transfer path for transferring input/output data and a signal relative to each of said partial memories at intervals of data transfer cycle time, and a clock supply system, wherein said input/output data and said signal are sequentially transferred through a plurality of storage means being disposed on said transfer path at an interval of a distance which said input/output data and said signal can travel in a machine cycle defined by a clock supplied from said clock supply system.

44. A data read/write method for a memory having a plurality of partial memories for storing data, driving means for driving each partial memory, and a transfer path for transferring input/output data and a signal relative to each partial memory, wherein said input/output data and said signal are sequentially transferred through a plurality of storage means being disposed on said transfer path at an interval of a distance which said input/output data and said signal can reach in a data transfer cycle time of said driving means, said input/output data and said signal are sequentially transferred to and from each said partial memory by supplying said driving means for driving each partial memory with a transmission delay same as a transmission delay of said input/output data and said signal between said transfer path and each said partial memory, and a read/write operation of said input/output data to and from each said partial memory is delayed so as to match a transmission delay in said transfer path and each said partial memory.

45. A data transfer method for a computer system having a processor for processing data, a plurality of partial memories for storing the data, a transfer path for transferring input/output data and a signal relative to each partial memory at intervals of data transfer cycle time, driving means for driving each of said partial memories, wherein said input/output data and said signal are sequentially transferred through a plurality of storage means being disposed on said transfer path at an interval of a distance which said input/output data and said signal can travel in said data transfer cycle time of said driving means.

46. A data transfer method for a computer system having a processor for processing data, a plurality of partial memories for storing the data, driving means for driving each partial memory, and a transfer path for transferring input/output data and a signal relative to each partial memory, wherein said plurality of partial memories are connected by said transfer path including a plurality of storage means, and said input/output data is delayed by supplying said driving means for driving each partial memory with a transmission delay same as a transmission delay of said input/output data and said signal between said transfer path and each said partial memory.

47. A data transfer method for a computer system having a processor for processing data, a plurality of partial memories for storing the data, a transfer path for transferring input/output data and a signal relative to each partial memory, and a clock supply system for supplying a clock to each partial memory, a plurality of partial memories being connected via the transfer path including a plurality of storage means disposed at an interval of a distance which data can reach in a machine cycle time defined by a clock supplied from the clock supply system, said data transfer method comprising the steps of:

driving each said partial memory by supplying said clock with a transmission delay same as a transmission delay of a data read request from said transfer path to each said partial memory;

delaying an output clock for output data so as to match a delay in driving each said partial memory; and sequentially transferring data to be sent from said processor to said plurality of partial memories and data sent from said plurality of partial memories, through said transfer path in one machine cycle.

48. A data transfer method for a computer system according to claim 44, wherein in reading data from each said partial memory, part of an inputted read address is decoded in each said partial memory to generate selection information for selecting each said partial memory, and a read operation starts thereafter.

49. A data transfer method for a computer system according to claim 47, wherein in reading data from each said partial memory, partial memory selection information is generated in advance, said partial memory selection information and an address are sequentially transferred via said transfer path to each selected partial memory, and when said address reaches said selected partial memory, a read operation starts to read data from said selected partial memory at a location designated by said address.

50. A data transfer method for a computer system according to claim 47, wherein read data outputted from each said partial memory is selected by a read data selector if said read data does not conflict with other read data outputted from other partial memories.

51. A data transfer method for a computer system according to claim 47, wherein in writing data in each said partial memory, part of a write address inputted for selecting one of said partial memories to be written is decoded in each said partial memory to generate selection information, and a write operation starts thereafter.

52. A data transfer method for a computer system according to claim 47, wherein in writing data in each said partial memory, partial memory selection information is generated in advance, said partial memory selection information, an address, and write data are sequentially transferred via said transfer path to each selected partial memory, and when said address and said write data reach said selected partial memory, a write operation starts to write data in said selected partial memory at a location designated by said address.

53. A data transfer method for a computer system according to claim 47, wherein a read data controller controls a read data selector in accordance with status information sent from an internal status register and a preceding stage status register, and generates status information to be sent to the next stage status register.

54. A memory comprising:

a plurality of partial memories;

at least one first temporary storage means provided for each of said partial memories for supplying an address from outside of said memory to a corresponding one of said partial memories, said first temporary storage means provided for said partial memories being connected in series;

at least one second temporary storage means provided for each of said partial memories for supplying input data from outside of said memory to a corresponding one of said partial memories, said second temporary storage means provided for said partial memories being connected in series;

at least one third temporary storage means provided for each of said partial memories for receiving output data from a corresponding one of said partial memories and outputting said output data to outside of said memory, said third temporary storage means provided for said partial memory being connected in series; and means for supplying a clock signal to said first, second, and third temporary storage means; and wherein in each of said first, second, and third temporary storage means, a distance between two adjacent temporary storage means is shorter than a maximum distance which contents in each of said temporary storage means can travel in a machine cycle time defined by a clock supplied from said clock supplying means, and in each of said first, second, and third temporary storage means, contents stored in each of said temporary storage means are transferred to a successive temporary storage means in every machine cycle, wherein one data transfer time equals two machine cycles.

55. The computer system recited in claim 22, wherein said memory, said transfer path, said plurality of storage means, and said driving means are disposed on a single chip.

56. The computer system recited in claim 55, wherein a processor is mounted on said chip.

* * * * *